(12) United States Patent　　　　(10) Patent No.:　US 12,604,489 B2
Choi et al.　　　　　　　　　　　　(45) Date of Patent:　　　Apr. 14, 2026

(54) SEMICONDUCTOR DEVICES

(71) Applicant: SAMSUNG ELECTRONICS CO., LTD., Suwon-si (KR)

(72) Inventors: Junrak Choi, Suwon-si (KR); Yaejin Hong, Suwon-si (KR); Jinsu Lee, Suwon-si (KR); Hongsik Chae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 287 days.

(21) Appl. No.: 18/221,495

(22) Filed: Jul. 13, 2023

(65) Prior Publication Data

US 2024/0021664 A1　　Jan. 18, 2024

(30) Foreign Application Priority Data

Jul. 15, 2022　(KR) ........................ 10-2022-0087756

(51) Int. Cl.
H10D 1/68　　　　(2025.01)
H10B 12/00　　　(2023.01)

(52) U.S. Cl.
CPC ........... H10D 1/696 (2025.01); H10B 12/315 (2023.02); H10B 12/482 (2023.02); H10B 12/485 (2023.02); H10D 1/716 (2025.01)

(58) Field of Classification Search
CPC .. H10B 12/00; H10B 12/033; H10B 12/0383; H10B 12/053; H10B 12/30; H10B 12/315; H10B 12/482; H10B 12/485; H10D 1/68; H10D 1/696; H10D 1/692; H10D 1/716
See application file for complete search history.

(56) References Cited

U.S. PATENT DOCUMENTS

| | | |
|---|---|---|
| 6,689,623 B2 | 2/2004 | Hong |
| 2004/0135182 A1 | 7/2004 | An et al. |
| 2004/0266126 A1 | 12/2004 | Lee |
| 2008/0160687 A1 | 7/2008 | Kim |
| 2009/0008743 A1 | 1/2009 | Lee et al. |
| 2011/0242727 A1 | 10/2011 | Kim et al. |
| 2012/0193757 A1 | 8/2012 | Shih et al. |

(Continued)

FOREIGN PATENT DOCUMENTS

| | | |
|---|---|---|
| KR | 10-0481867 B1 | 4/2005 |
| KR | 10-2011-0111141 A | 10/2011 |

(Continued)

*Primary Examiner* — Brook Kebede
(74) *Attorney, Agent, or Firm* — Muir Patent Law, PLLC

(57) ABSTRACT

A semiconductor device includes a substrate, lower electrodes on the substrate, a dielectric layer covering the lower electrodes, and an upper electrode covering the dielectric layer. Each of the lower electrodes includes a first electrode layer having a cylindrical shape, a first insertion layer disposed on the first electrode layer and having a cylindrical shape, a second electrode layer disposed on the first insertion layer and extending to cover an upper end of the first electrode layer and an upper end of the first insertion layer. At least one of the first electrode layer and the second electrode layer has a first stress, and the first insertion layer has a second stress, different from the first stress. The first stress is one of tensile stress and compressive stress, and the second stress is the other of the tensile stress and the compressive stress.

20 Claims, 18 Drawing Sheets

(56)　　　　　References Cited

U.S. PATENT DOCUMENTS

| | | | |
|---|---|---|---|
| 2013/0228837 A1* | 9/2013 | Sukekawa | H10B 12/033 |
| | | | 257/532 |
| 2013/0285202 A1* | 10/2013 | Koyanagi | H10D 1/042 |
| | | | 257/532 |
| 2015/0311210 A1* | 10/2015 | Sugioka | H10B 12/033 |
| | | | 257/532 |
| 2018/0019300 A1 | 1/2018 | Lee et al. | |
| 2020/0266265 A1 | 8/2020 | Kang et al. | |
| 2021/0408225 A1 | 12/2021 | Seo et al. | |

FOREIGN PATENT DOCUMENTS

| | | |
|---|---|---|
| KR | 10-2020-0101762 A | 8/2020 |
| KR | 10-2022-0001214 A | 1/2022 |

\* cited by examiner

100

CAP

170

Y

X

Z

100'

180a —    171a  ⎫
190a —    172a  ⎬ 170a
      173a_1 ⎭

Y
|
→ X
Z

V–V'

SP3 —    180a
     190a
     173a_2(170a)

Y
|
→ X
Z

VI–VI'

IX_IX'

X_X'

SEMICONDUCTOR DEVICES

CROSS-REFERENCE TO RELATED APPLICATION

This application claims benefit of priority to Korean Patent Application No. 10-2022-0087756, filed on Jul. 15, 2022, in the Korean Intellectual Property Office, the disclosure of which is incorporated herein by reference in its entirety.

BACKGROUND

1. Field

Example embodiments relate to semiconductor devices.

2. Description of the Related Art

With the demand for high integration and size reductions of semiconductor devices, a size of a data storage structure in a semiconductor device has been reduced. Accordingly, various studies have been conducted to structurally optimize a data storage structure for storing data in a dynamic random-access memory (DRAM).

SUMMARY

According to an example embodiment, a semiconductor device includes a substrate, a plurality of lower electrodes on the substrate, a dielectric layer covering the plurality of lower electrodes, and an upper electrode covering the dielectric layer. Each of the plurality of lower electrodes includes a first electrode layer having a cylindrical shape, a first insertion layer disposed on the first electrode layer and having a cylindrical shape, a second electrode layer disposed on the first insertion layer and extending to cover an upper end of the first electrode layer and an upper end of the first insertion layer. At least one of the first electrode layer and the second electrode layer has a first stress, and the first insertion layer has a second stress, different from the first stress. The first stress is one of tensile stress and compressive stress, and the second stress is the other thereof.

According to an example embodiment, a semiconductor device includes a substrate, a plurality of lower electrodes on the substrate, a dielectric layer covering the plurality of lower electrodes, and an upper electrode covering the dielectric layer. Each of the plurality of lower electrodes includes a first electrode layer, a second electrode layer on the first electrode layer, and an insertion layer disposed between the first electrode layer and the second electrode layer to be surrounded by the first electrode layer and the second electrode layer, having a cylindrical shape, and including a metal oxide.

According to an example embodiment, a semiconductor device includes an isolation layer defining active regions on a substrate, gate electrodes crossing the active regions and extending inwardly of the isolation layer, first impurity regions and second impurity regions disposed in the active regions on opposite sides adjacent to the gate electrodes, bit lines disposed on the gate electrodes and the active regions, and electrically connected to the first impurity regions, conductive patterns disposed on side surfaces of the bit lines and electrically connected to the second impurity regions, a plurality of lower electrodes extending vertically on the conductive patterns and electrically connected to each of the conductive patterns, at least one supporter layer contacting a side surface of each of the plurality of lower electrodes, a dielectric layer covering the plurality of lower electrodes and the at least one supporter layer, and an upper electrode covering the dielectric layer. Each of the plurality of lower electrodes includes a first electrode layer having a cylindrical shape, an insertion layer disposed on an internal surface of the first electrode layer, having a cylindrical shape, and including a metal oxide, and a second electrode layer disposed on an internal surface of the insertion layer and extending to cover an upper end of the first electrode layer and an upper end of the insertion layer.

BRIEF DESCRIPTION OF DRAWINGS

Features will become apparent to those of skill in the art by describing in detail exemplary embodiments with reference to the attached drawings.

DETAILED DESCRIPTION

Figure 1A:
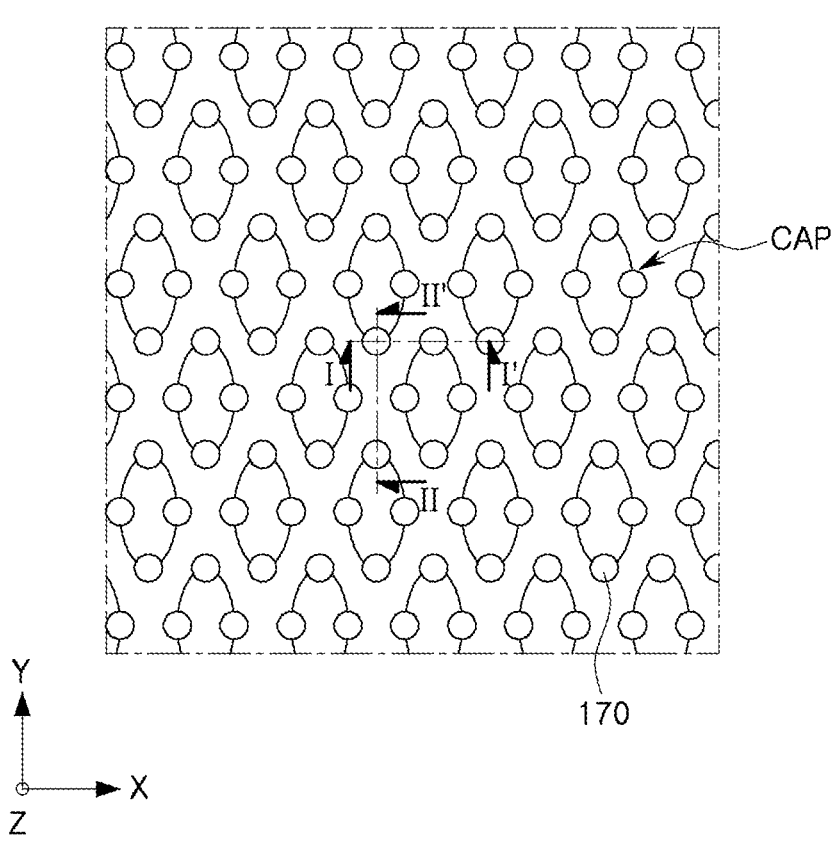
FIG. 1A is a schematic layout diagram of a semiconductor device according to example embodiments.
Figure 1B:
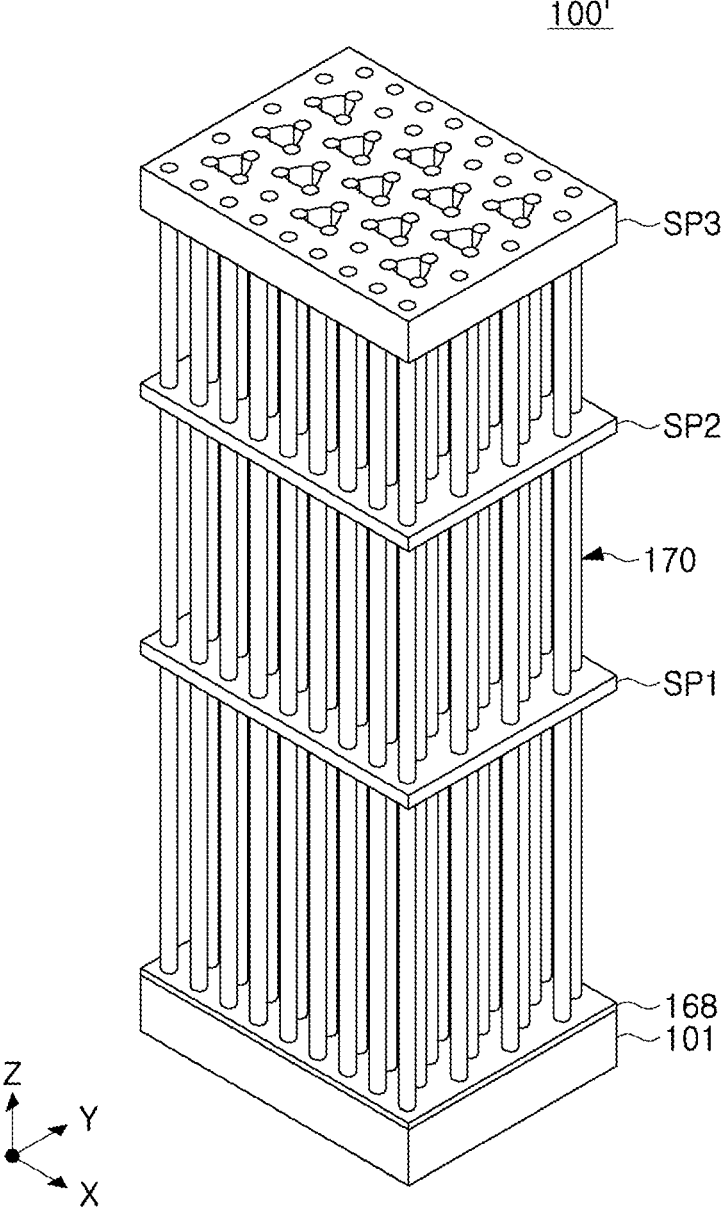
FIG. 1B is a schematic perspective view of a semiconductor device according to example embodiments.
Figure 1C:
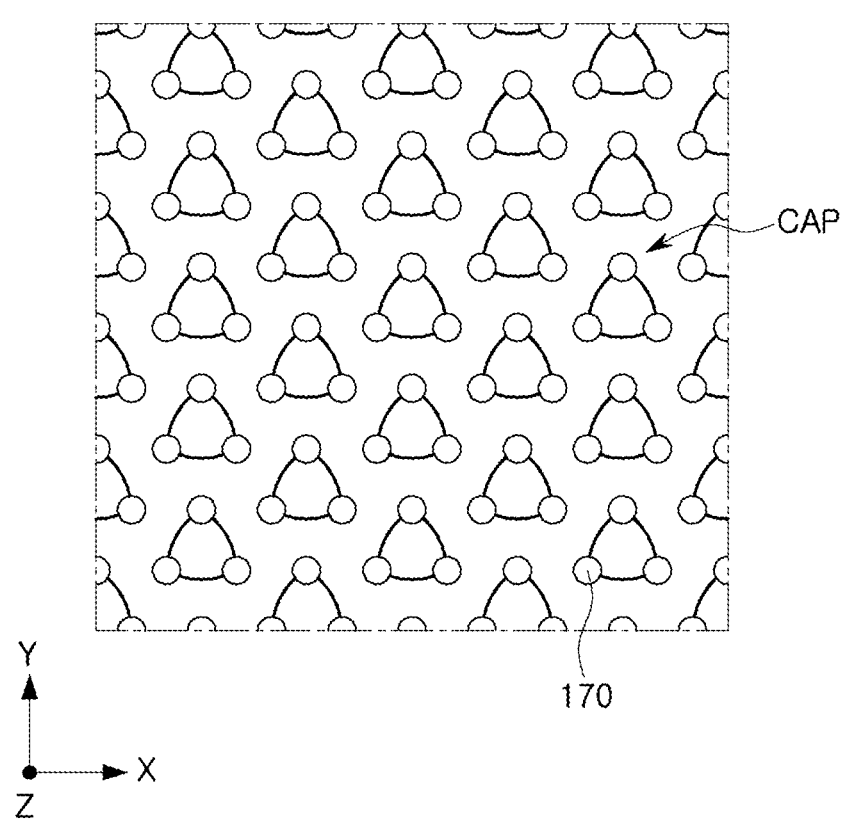
FIG. 1C is a schematic layout diagram of a semiconductor device according to example embodiments.

FIG. 1A is a schematic layout diagram of a semiconductor device 100 according to example embodiments, FIG. 1B is a schematic perspective view of a semiconductor device 100' according to example embodiments, and FIG. 1C is a schematic layout diagram of the semiconductor device 100' according to example embodiments.

Figure 2:
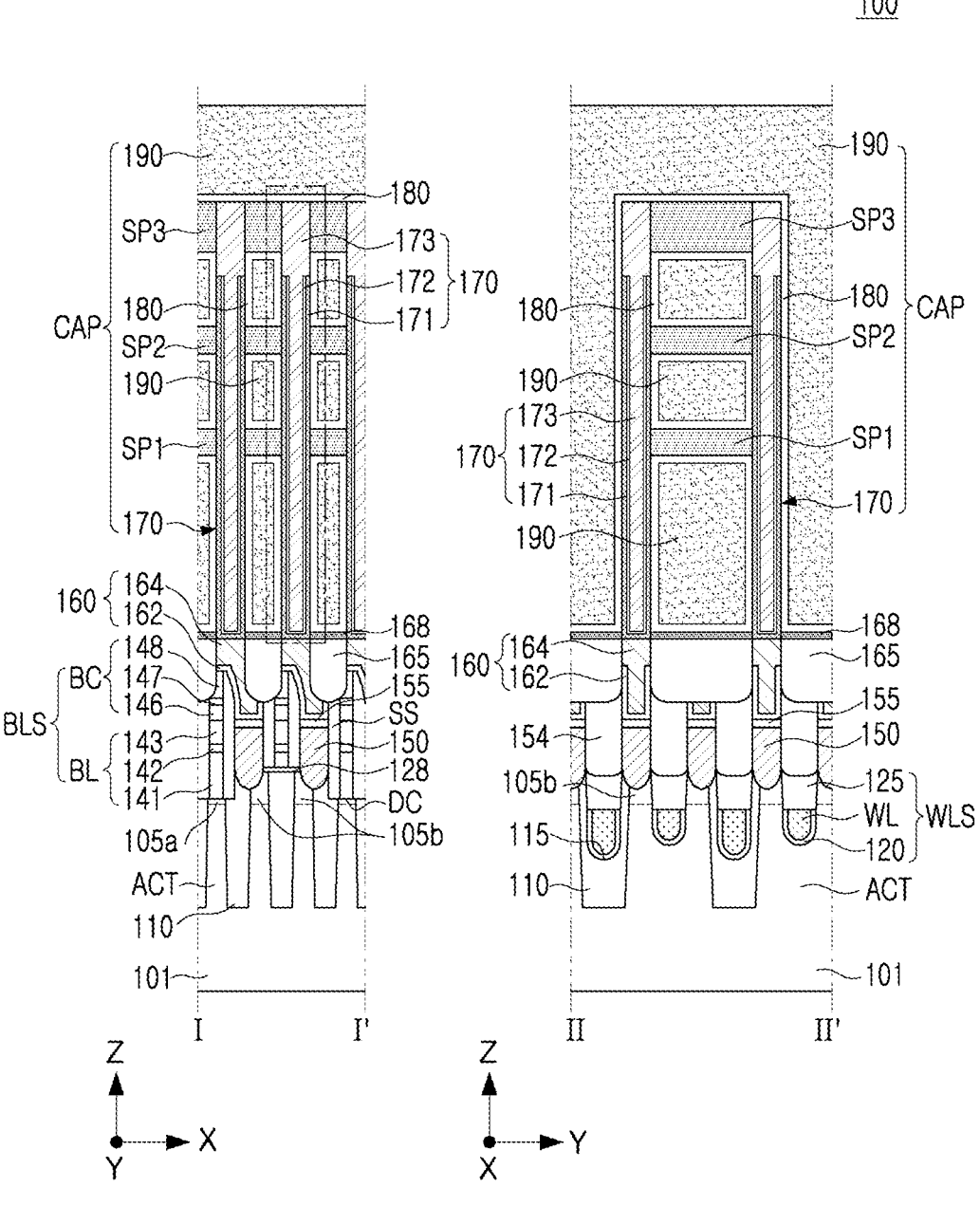
FIG. 2 is a schematic cross-sectional view of a semiconductor device according to example embodiments.
Figure 3A:
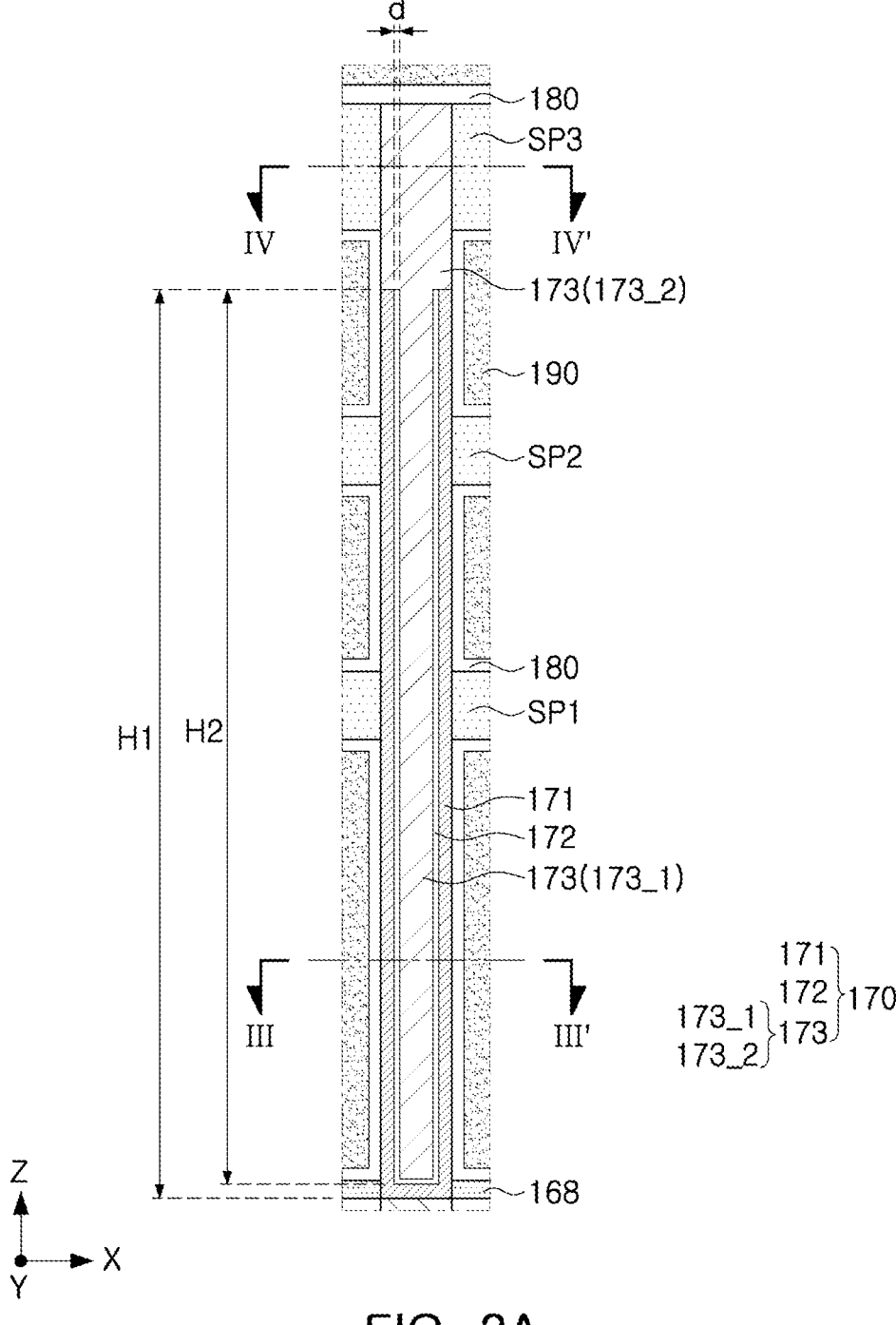
FIG. 3A is a schematic partially-enlarged view of a semiconductor device according to example embodiments.
Figure 3B:
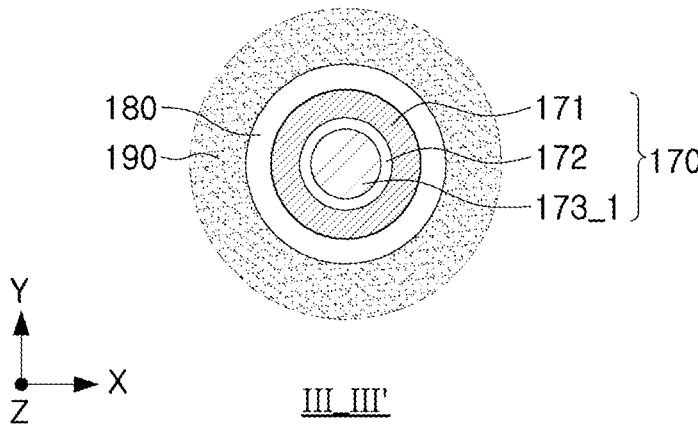
FIGS. 3B and 3C are schematic cross-sectional views of a semiconductor device according to example embodiments.
Figure 3C:
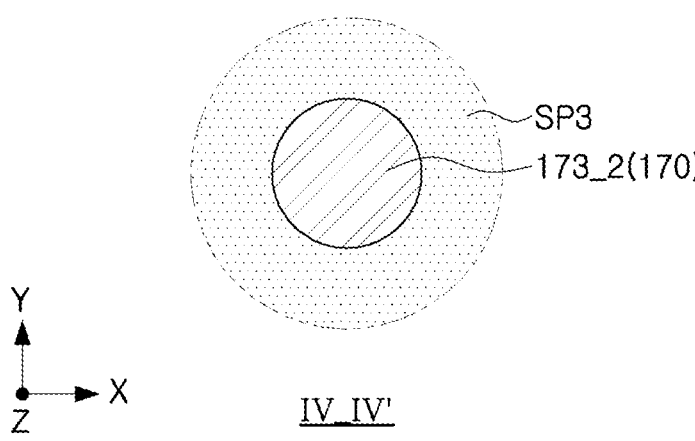

FIG. 2 is a schematic cross-sectional view of the semiconductor device 100 along lines I-I' and of FIG. 1A. FIG. 3A is a schematic partially-enlarged view of the semiconductor device 100 according to example embodiments, and FIGS. 3B and 3C are schematic cross-sectional views of the semiconductor device 100 along lines and IV-IV', respectively, of FIG. 3A. For ease of description, only main components of semiconductor devices are illustrated in FIGS. 1A to 1C, FIG. 2, and FIGS. 3A to 3C.

Referring to FIGS. 1A, 2, and 3A to 3C, the semiconductor device 100 may include a substrate 101 with active regions ACT, isolation layers 110 defining the active regions ACT in the substrate 101, a word line structure WLS buried in the substrate 101 and including a word line WL extending, e.g., lengthwise, in a first direction X, a bit line structure BLS extending, e.g., lengthwise, in a second direction Y to intersect the word line structure WLS on the substrate 101 and including a bit line BL, and a data storage structure CAP on the bit line structure BLS. The data storage structure CAP may store data, e.g., information, and may be, e.g., a capacitor structure of a DRAM. The semiconductor device 100 may further include a lower conductive pattern 150 on the active region ACT, an upper conductive pattern 160 on the lower conductive pattern 150, and an insulating pattern 165 penetrating through the upper conductive pattern 160.

The semiconductor device 100 may include, e.g., a cell array of a DRAM. For example, the bit line BL may be connected to a first impurity region 105a of an active region ACT, and may be electrically connected to the data storage structure CAP on the upper conductive pattern 160 through the lower and upper conductive patterns 150 and 160. The data storage structure CAP may include lower electrodes 170, a dielectric layer 180 on the lower electrodes 170, and an upper electrode 190 on the dielectric layer 180. Each of the lower electrodes 170 may include a first electrode layer 171, an insertion layer 172, and a second electrode layer 173. The data storage structure CAP may further include supporter layers SP1, SP2, and SP3.

The semiconductor device 100 may include a cell array region, in which a cell array is disposed, and a peripheral circuit region in which peripheral circuits for driving memory cells, disposed in the cell array, are disposed. The peripheral circuit region may be disposed around the cell array region.

The substrate 101 may include a semiconductor material, e.g., a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be, e.g., a silicon substrate, a silicon-on-insulator (SOI) substrate, a germanium substrate, a germanium-on-insulator (GOI) substrate, a silicon-germanium substrate, or a substrate including an epitaxial layer.

The active regions ACT may be defined in the substrate 101 by the isolation layers 110. The active region ACT may have a bar shape, and may be disposed to have an island shape extending in the substrate 101 in one direction. The one direction may be a direction inclined with respect to a direction in which the word lines WL and the bit lines BL extend. The active regions ACT may be arranged to be parallel to each other, and an end portion of one active region ACT may be disposed to be adjacent to a center of another active region ACT adjacent to the one active region ACT.

The active region ACT may have first and second impurity regions 105a and 105b having a predetermined depth from an upper surface of the substrate 101. The first and second impurity regions 105a and 105b may be spaced apart from each other. The first and second impurity regions 105a and 105b may serve as source/drain regions of a transistor formed by the word line WL. The source region and the drain region may be formed by the first and second impurity regions 105a and 105b formed by doping substantially the same impurities or implanting ions, and may be interchangeably referred to, depending on a circuit configuration of a finally formed transistor. The impurities may include impurities having a conductivity type opposite to a conductivity type of the substrate 101. In example embodiments, depths of the first and second impurity regions 105a and 105b in the source region and the drain region may be different from each other.

The isolation layer 110 may be formed by a shallow trench isolation (STI) process. The isolation layer 110 may electrically isolate the active regions ACT from each other while surrounding the active regions ACT. The isolation layer 110 may be formed of an insulating material, e.g., a silicon oxide, a silicon nitride, or a combination thereof. The isolation layer 110 may include a plurality of regions having lower ends having different depths depending on a width of a trench formed by etching the substrate 101.

The word line structures WLS may be disposed in gate trenches 115 extending within the substrate 101. Each of the word line structures WLS may include a gate dielectric layer 120, a word line WL, and a gate capping layer 125. In the present specification, a "gate" may refer to a structure including the gate dielectric layer 120 and the word line WL, while the word line WL may be referred to as a "gate electrode," and the word line structure WLS may be referred to as a "gate structure."

The word line WL may be disposed to extend in the first direction X across the active region ACT. For example, a pair of adjacent word lines WL may be disposed to cross one active region ACT. The word line WL may constitute a gate of a buried channel array transistor (BCAT), but example embodiments are not limited thereto, e.g., the word lines WL may be disposed on the substrate 101. The word line WL may be disposed below the gate trench 115 to have a predetermined thickness. An upper surface of the word line WL may be disposed at a level lower than a level of the upper surface of the substrate 101. In the present specification, a high "level" and a low "level" may be defined based on a substantially planar lower surface of the substrate 101.

The word line WL may be formed of a conductive material, e.g., at least one of polycrystalline silicon (Si), titanium (Ti), titanium nitride (TiN), tantalum (Ta), tantalum nitride (TaN), tungsten (W), tungsten nitride (WN), and aluminum (Al). For example, the word line WL may include a lower pattern and an upper pattern formed of different materials. The lower pattern may include, e.g., at least one of tungsten (W), titanium (Ti), tantalum (Ta), tungsten nitride (WN), titanium nitride (TiN), and tantalum nitride (TaN), and the upper pattern may be a semiconductor pattern including polysilicon doped with P-type or N-type impurities.

The gate dielectric layer 120 may be disposed on a bottom surface and an internal surface of the gate trench 115. The gate dielectric layer 120 may conformally cover the internal wall of the gate trench 115. The gate dielectric layer 120 may include at least one of, e.g., a silicon oxide, a silicon nitride, and a silicon oxynitride. The gate dielectric layer 120 may be, e.g., a silicon oxide layer or an insulating layer having a high dielectric constant. In example embodiments, the gate dielectric layer 120 may be a layer formed by oxidizing the active region ACT or a layer formed by deposition.

The gate capping layer 125 may be disposed to fill the gate trench 115 on the word line WL. An upper surface of the gate capping layer 125 may be disposed at substantially the same level as the upper surface of the substrate 101. The gate capping layer 125 may be formed of an insulating material, e.g., a silicon nitride.

The bit line structure BLS may extend in one direction, e.g., the second direction Y, perpendicular to the word line WL. The bit line structure BLS may include a bit line BL and a bit line capping pattern BC on the bit line BL.

The bit line BL may include a first conductive pattern 141, a second conductive pattern 142, and a third conductive pattern 143 stacked sequentially. The bit line capping pattern BC may be disposed on the third conductive pattern 143. A buffer insulating layer 128 may be disposed between the first conductive pattern 141 and the substrate 101, and a portion of the first conductive pattern 141 (hereinafter referred to as a "bit line contact pattern DC") may contact the first impurity region 105a of the active region ACT. The bit line BL may be electrically connected to the first impurity region 105a through the bit line contact pattern DC. A lower surface of the bit line contact pattern DC may be disposed at a level lower than a level of the upper surface of the substrate 101, and may be disposed at a level higher than a level of an upper surface of the word line WL. In an example embodiment, the bit line contact pattern DC may be locally disposed in a bit line contact hole formed in the substrate 101 to expose the first impurity region 105a.

The first conductive pattern 141 may include a semiconductor material, e.g., polycrystalline silicon. The first conductive pattern 141 may directly contact the first impurity region 105a. The second conductive pattern 142 may include a metal-semiconductor compound. The metal-semiconductor compound may be, e.g., a layer formed by siliciding a portion of the first conductive pattern 141. The metal-semiconductor compound may include, e.g., cobalt silicide (CoSi), titanium silicide (TiSi), nickel silicide (NiSi), tungsten silicide (WSi), and/or other metal silicides. The third conductive pattern 143 may include a metal material, e.g., titanium (Ti), tantalum (Ta), tungsten (W), and/or aluminum (Al). The number of conductive patterns constituting the bit line BL, the type of material thereof, and/or the stacking order thereof may vary according to example embodiments.

The bit line capping pattern BC may include a first capping pattern 146, a second capping pattern 147, and a third capping pattern 148, sequentially stacked on the third conductive pattern 143. Each of the first to third capping patterns 146, 147, and 148 may include an insulating material, e.g., a silicon nitride. The first to third capping patterns 146, 147, and 148 may be formed of different materials. Even when the first to third capping patterns 146, 147, and 148 are formed of the same material, boundaries therebetween may be distinct due to a difference in physical properties. A thickness of the second capping pattern 147 may be lower than a thickness of the first capping pattern 146 and lower than a thickness of the third capping pattern 148. The number of capping patterns and/or the type of material constituting the bit line capping pattern BC may vary according to example embodiments.

Spacer structures SS may be disposed on opposite sidewalls of each of the bit line structures BLS to extend in one direction, e.g., the second direction Y. The spacer structures SS may be disposed between the bit line structure BLS and the lower conductive pattern 150. The spacer structures SS may be disposed to extend along sidewalls of the bit line BL and sidewalls of the bit line capping pattern BC. A pair of spacer structures SS, disposed on opposite sides adjacent to a single bit line structure BLS, may be asymmetric with respect to the bit line structure BLS. Each of the spacer structures SS may include a plurality of spacer layers, and may further include an air spacer according to example embodiments.

The lower conductive pattern 150 may be connected to one region of the active region ACT, e.g., the second impurity region 105b. The lower conductive pattern 150 may be disposed between the bit lines BL and between the word lines WL. The lower conductive pattern 150 may penetrate through the buffer insulating layer 128 to be connected to the second impurity region 105b of the active region ACT. The lower conductive pattern 150 may directly contact the second impurity region 105b. A lower surface of the lower conductive pattern 150 may be disposed at a level lower than a level of the upper surface of the substrate 101, and may be disposed at a level higher than a level of the lower surface of the bit line contact pattern DC. The lower conductive pattern 150 may be insulated from the bit line contact pattern DC by the spacer structure SS. The lower conductive pattern 150 may be formed of a conductive material and may include at least one of, e.g., polycrystalline silicon (Si), titanium (Ti), titanium nitride (TiN), tantalum (Ta), tantalum nitride (TaN), tungsten (W), tungsten nitride (WN), and aluminum (Al). In example embodiments, the lower conductive pattern 150 may include a plurality of layers.

A metal-semiconductor compound layer 155 may be disposed between the lower conductive pattern 150 and the upper conductive pattern 160. The metal-semiconductor compound layer 155 may be, e.g., a layer formed by siliciding a portion of the lower conductive pattern 150 when the lower conductive pattern 150 includes a semiconductor material. The metal-semiconductor compound layer 155 may include, e.g., cobalt silicide (CoSi), titanium silicide (TiSi), nickel silicide (NiSi), tungsten silicide (WSi), and/or other metal silicides. According to example embodiments, the metal-semiconductor compound layer 155 may be omitted.

The upper conductive pattern 160 may be disposed on the lower conductive pattern 150. The upper conductive pattern 160 may extend between the spacer structures SS to cover the upper surface of the metal-semiconductor compound layer 155. The upper conductive pattern 160 may include a barrier layer 162 and a conductive layer 164. The barrier layer 162 may cover a lower surface and side surfaces of the conductive layer 164. The barrier layer 162 may include a metal nitride, e.g., at least one of titanium nitride (TiN), tantalum nitride (TaN), and tungsten nitride (WN). The conductive layer 164 may include a conductive material, e.g., at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

The insulating patterns 165 may be disposed to penetrate through the upper conductive pattern 160. The upper conductive pattern 160 may be divided into a plurality of upper conductive patterns 160 by the insulating patterns 165. The insulating patterns 165 may include an insulating material, e.g., at least one of a silicon oxide, a silicon nitride, and a silicon oxynitride.

An etch-stop layer 168 may cover the insulating patterns 165 between the lower electrodes 170. The etch-stop layer 168 may contact lower regions of side surfaces of the lower electrodes 170. The etch-stop layer 168 may be disposed below the supporter layers SP1, SP2, and SP3. An upper surface of the etch-stop layer 168 may include a portion directly contacting the dielectric layer 180. The etch-stop layer 168 may include at least one of, e.g., a silicon nitride and a silicon oxynitride.

The lower electrodes 170 may be disposed on the upper conductive patterns 160. The lower electrodes 170 may penetrate through the etch-stop layer 168 to contact the upper conductive patterns 160. The lower electrodes 170 may have a cylindrical shape, but example embodiments are not limited thereto, e.g., the lower electrodes 170 may have a hollow cylindrical shape. This will be described later with reference to FIG. 4A.

Each of the lower electrodes 170 may include the first electrode layer 171, the insertion layer 172, and the second electrode layer 173. The first electrode layer 171 may be disposed on the upper conductive patterns 160. The first electrode layer 171 may have a cylindrical shape, e.g., a hollow cylindrical shape, and may have a first height H1. The first height H1 may refer to a height from a bottom surface (i.e., a lowermost end or surface) of the first electrode layer 171 to an uppermost end of the first electrode layer 171. The first height H1 may be smaller than a height of the lower electrodes 170. In example embodiments, the first electrode layer 171 may have a substantially uniform thickness, e.g., in the first direction X.

The insertion layer 172 may be disposed, e.g., conformally, on the first electrode layer 171. The insertion layer 172 may be disposed, e.g., directly, between the first electrode layer 171 and the second electrode layer 173. The insertion layer 172 may be surrounded by the first electrode layer 171 and the second electrode layer 173. The insertion layer 172 may have a cylindrical shape, e.g., a hollow cylindrical shape having a U-shape or an inverted H-shape in a vertical cross-section. An external surface of the insertion layer 172 may, e.g., directly, contact an internal surface of the first electrode layer 171, and an internal surface of the insertion layer 172 may, e.g., directly, contact an external surface of a first portion 173_1 of the second electrode layer 173. In example embodiments, an upper end of the insertion layer 172 may be disposed at a substantially same level as an upper end of the first electrode layer 171, e.g., uppermost surfaces of the insertion layer 172 and the first electrode layer 171 may be coplanar. However, the shape of the insertion layer 172 is not limited thereto, e.g., the upper end of the insertion layer 172 may be disposed at a level lower than a level of the upper end of the first electrode layer 171.

The insertion layer 172 may have a second height H2. The second height H2 may refer to a height from a bottom surface (i.e., a lowermost end or surface) of the insertion layer 172 to an uppermost end of the insertion layer 172. The second height H2 may be about 30% to about 90% of the first height H1, e.g., a difference between the first height H1 and the second height H2 may equal a thickness of the first electrode layer 171. The insertion layer 172 may have a thickness d, e.g., in the first direction X. In example embodiments, the insertion layer 172 may have a substantially uniform thickness d. The thickness d of the insertion layer 172 may be greater than about 0 angstroms and less than about 10 angstroms, e.g., about 2 angstroms to about 4 angstroms. Since the insertion layer 172 has the second height H2 and a thickness d within the above-mentioned ranges, capacitance of the data storage structure CAP may be secured while preventing physical deformation of the lower electrode 170. The second electrode layer 173 may fill an internal space defined by the insertion layer 172, e.g., an internal space defined by the U-shape or the inverted H-shape, and may extend to cover upper ends, e.g., uppermost surfaces, of the first electrode layer 171 and the insertion layer 172. An upper surface of the second electrode layer 173 may be disposed at a level higher than a level of the upper end of the first electrode layer 171 and a level of the upper end of the insertion layer 172. The second electrode layer 173 may include a first portion 173_1, filling the internal empty space defined by the insertion layer 172, and a second portion 173_2 on the first portion 173_1. The first portion 173_1 may contact an internal surface of the insertion layer 172 and may have a pillar shape, e.g., a linear shape in a vertical cross-section. The second portion 173_2 may extend, e.g., integrally and continuously, from the first portion 173_1 and may have a pillar shape covering, e.g., completely and continuously, the upper ends of the first electrode layer 171 and the insertion layer 172. The second portion 173_2 may have a width (e.g., thickness) that is greater than a width of the first portion 173_1, e.g., in the first direction X. A side surface of the second portion 173_2 may include a portion vertically aligned with a side surface of the first electrode layer 171, e.g., lateral external sides of the second portion 173_2 and the first electrode layer 171 may be coplanar. In the present specification, the "first portion 173_1" and the "second portion 173_2" may be referred to as a "first pillar portion" and a "second pillar portion," respectively.

As illustrated in FIG. 3B, at a level of line of FIG. 3A, the lower electrode 170 may include the first portion 173_1, the insertion layer 172 surrounding the external surface of the first portion 173_1, and the first electrode layer 171 surrounding an external surface of the insertion layer 172. For example, as illustrated in FIG. 3B, the insertion layer 172 may have a circular shape in a top view, so the insertion layer 172 may continuously and directly contact the, e.g., entire, external surface of the first portion 173_1 and the, e.g., entire, internal surface of the first electrode layer 171. For example, as illustrated in FIG. 3B, the thickness of the insertion layer 172 may be smaller than the thickness of the first electrode layer 171.

As illustrated in FIG. 3C, at a level of line IV-IV' of FIG. 3A, the lower electrode 170 may include the second portion 173_2. For example, the second portion 173_2 may directly contact the third supporter layer SP3.

The insertion layer 172 may be disposed between the first electrode layer 171 and the second electrode layer 173, and may be surrounded by the first electrode layer 171 and the second electrode layer 173. An external surface of the insertion layer 172 may contact the first electrode layer 171, and an internal surface of the insertion layer 172 may contact the second electrode layer 173. An uppermost end of the insertion layer 172 may contact the second electrode layer 173. The insertion layer 172 may be surrounded by the first electrode layer 171 and the second electrode layer 173 in all directions. The insertion layer 172 has a structure surrounded, e.g., completely enclosed, by the first electrode layer 171 and the second electrode layer 173, so that damage to the insertion layer 172 may be prevented. In example embodiments, the first electrode layer 171 and the second electrode layer 173 may prevent a mold etchant (e.g., hydrogen fluoride (HF)), used in the process of forming the upper electrode 190, from permeating into the insertion layer 172 to prevent damage to the insertion layer 172.

The insertion layer 172 may include a material different from a material of the first electrode layer 171 and the second electrode layer 173. The insertion layer 172 may include a material having stress in a direction different from a direction of stress of the material included in the first electrode layer 171 and the second electrode layer 173. In example embodiments, at least one of the first electrode layer 171 and the second electrode layer 173 may have, e.g., exhibit, one of compressive stress and tensile stress. The insertion layer 172 may have the other of the compressive stress and the tensile stress. For example, the first electrode layer 171 and the second electrode layer 173 may have tensile stress, and the insertion layer 172 may have compressive stress. In exemplary embodiments, the first electrode layer 171 and the second electrode layer 173 may include a conductive material having tensile stress, e.g., at least one of polycrystalline silicon (Si), TiN, NbN, WN, VN, MoN, TaN, TiSiN, and TiCN. The first electrode layer 171 and the second electrode layer 173 may include the same material or different materials. The insertion layer 172 may include a metal oxide having compressive stress. The insertion layer 172 may include at least one of, e.g., TiO, NbO, MoO, TaO, and TiON.

The insertion layer 172 may have a stress in a direction opposite to the direction of the stress of the first electrode layer 171 and the second electrode layer 173, in order to offset the overall stress of the lower electrodes 170. Accordingly, physical deformation of the lower electrodes 170, e.g., caused by the stress of the first electrode layer 171 and the second electrode layer 173 (e.g., collapse and bending of the lower electrodes 170) may be prevented.

One or more supporter layers SP1, SP2, and SP3 may be provided between adjacent lower electrodes 170 to support the lower electrodes 170. For example, a first supporter layer SP1, a second supporter layer SP2, and a third supporter layer SP3 may be provided between the adjacent lower electrodes 170 to contact the lower electrodes 170.

Referring to FIG. 1A, in a plan view viewed from above, the lower electrodes 170 may have a regular arrangement. For example, the lower electrodes 170 may be disposed to be spaced apart by a predetermined distance in the first direction X and disposed in a zigzag pattern in the second direction Y.

A through-hole pattern may be disposed between the plurality of adjacent lower electrodes 170. In example embodiments, as illustrated in the semiconductor device 100 of FIG. 1A, a single through-hole pattern may be disposed between four adjacent lower electrodes 170. However, the through-hole pattern is not limited thereto. In other embodiments, as illustrated in a semiconductor device 100' of FIGS. 1B and 1C, a single through-hole pattern may be disposed between three adjacent lower electrodes 170.

The supporter layers SP1, SP2, and SP3 may include the first supporter layer SP1, the second supporter layer SP2 on the first supporter layer SP1, and the third supporter layer SP3 on the second supporter layer SP2. The supporter layers SP1, SP2, and SP3 may be disposed to be spaced apart from the substrate 101 in a direction perpendicular to the upper surface of the substrate 101, e.g., in a third direction Z. The supporter layers SP1, SP2, and SP3 may contact the lower electrodes 170 and extend in a direction parallel to the upper surface of the substrate 101.

The first supporter layer SP1 and the second supporter layer SP2 may contact the first electrode layer 171, and may be spaced apart from the second electrode layer 173. The third supporter layer SP3 may contact the second portion 173_2 of the second electrode layer 173. The supporter layers SP1, SP2, and SP3 may include a portion directly contacting the lower electrodes 170 and the dielectric layer 180. For example, as illustrated in FIG. 2, the third supporter layer SP3 may have a thickness higher than a thickness of each of the first supporter layer SP1 and the second supporter layer SP2, e.g., in the third direction Z. The supporter layers SP1, SP2, and SP3 may be layers supporting the lower electrodes 170 having a high aspect ratio. Each of the supporter layers SP1, SP2, and SP3 may include, e.g., at least one of a silicon nitride and a silicon oxynitride, or a material similar thereto. The number, thickness, and/or dispositional relationship of the supporter layers SP1, SP2, and SP3 may be adjusted according to example embodiments.

The dielectric layer 180 may cover the lower electrodes 170 on surfaces of the lower electrodes 170. The dielectric layer 180 may be disposed between the lower electrodes 170 and the upper electrode 190. The dielectric layer 180 may cover upper and lower surfaces of the supporter layers SP1, SP2, and SP3. The dielectric layer 180 may cover an upper surface of the etch-stop layer 168.

The dielectric layer 180 may include, e.g., a high-κ dielectric material, a silicon oxide, a silicon nitride, or a combination thereof. However, in some embodiments, the dielectric layer 180 may be an oxide, a nitride, a silicide, an oxynitride, or silicide oxynitride including one of hafnium (Hf), aluminum (Al), zirconium (Zr), and lanthanum (La).

The upper electrode 190 may cover the plurality of lower electrodes 170, the supporter layers SP1, SP2, and SP3, and the dielectric layer 180. The upper electrode 190 may fill a space between the plurality of lower electrodes 170 and a space between the supporter layers SP1, SP2, and SP3. The upper electrode 190 may directly contact the dielectric layer 180.

For example, the upper electrode 190 may include a single electrode layer, as illustrated in FIG. 2. In other examples, the upper electrode 190 may include a plurality of electrode layers. The upper electrode 190 may include a conductive material. The upper electrode 190 may include at least one of, e.g., polycrystalline silicon (Si), TiN, NbN, WN, VN, MoN, TaN, TiSiN, and TiCN.

Semiconductor devices according to example embodiments will be described with reference to FIGS. 4A to 4C, 5A to 5C, and 6A to 6C. The semiconductor devices illustrated in FIGS. 4A to 4C, 5A to 5C, and 6A to 6C are different from the semiconductor device according to the previous embodiment of FIGS. 1A to 3C, in terms of a structure of lower electrodes.

In the embodiments of FIGS. 4A to 4C, 5A to 5C, and 6A to 6C, when components have the same reference numerals as those of FIGS. 1A to 3C but have alphabetic characters, it is to describe an example embodiment, different from the example embodiment of FIGS. 1A to 3C. Features described with the same reference numerals are the same or similar.

Figure 4A:
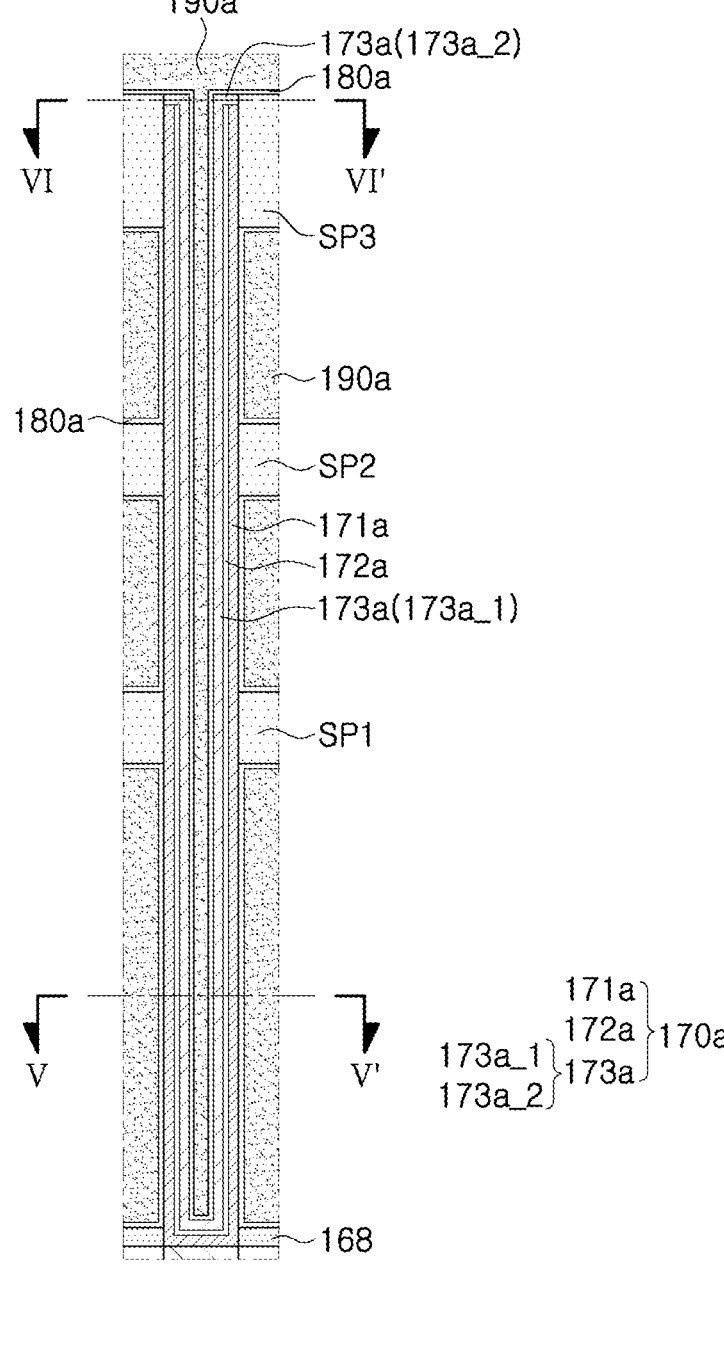
FIG. 4A is a schematic partially-enlarged view of a semiconductor device according to example embodiments.
Figure 4B:
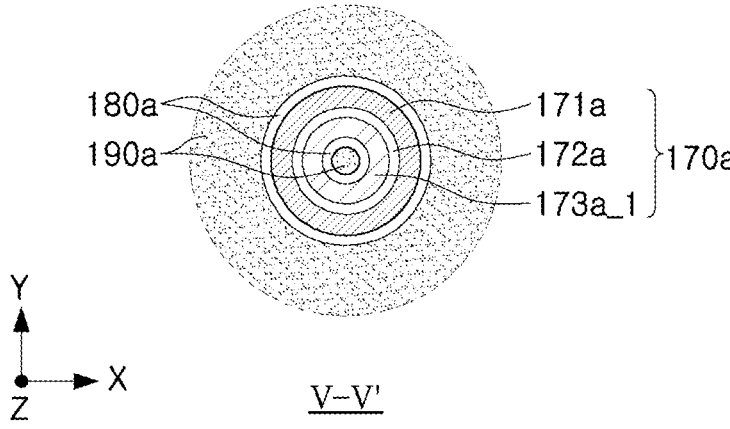
FIGS. 4B and 4C are schematic cross-sectional views of a semiconductor device according to example embodiments.
Figure 4C:
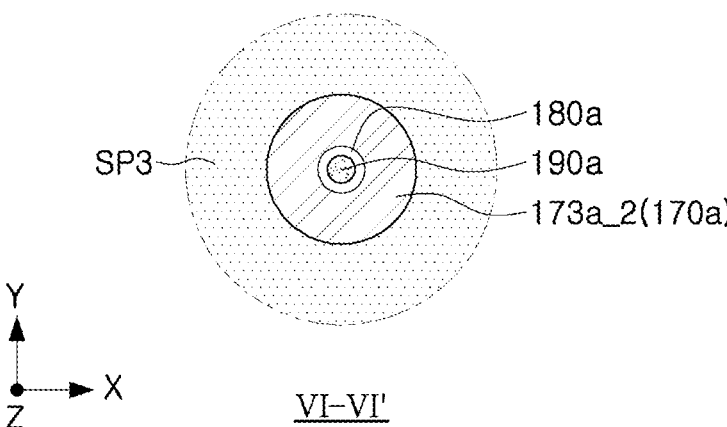

FIG. 4A is a schematic partially-enlarged view of a region of a data storage structure of a semiconductor device according to example embodiments, and FIGS. 4B and 4C are schematic cross-sectional views of a data storage structure of a semiconductor device according to example embodiments. FIGS. 4B and 4C illustrate cross-sections taken along lines V-V and VI-VI' of FIG. 4A.

Referring to FIGS. 4A to 4C, lower electrodes 170a may each have a cylindrical shape.

Each of the lower electrodes 170a may include a first electrode layer 171a, an insertion layer 172a, and a second electrode layer 173a. The first electrode layer 171a may have a cylindrical shape. The insertion layer 172a may have a cylindrical shape and may be disposed on an internal surface of the first electrode layer 171a. The second electrode layer 173a may include a first portion 173a_1, disposed on the insertion layer 172a, and a second portion 173a_2 extending from the first portion 173a_1. For example, as illustrated in FIG. 4A, the first portion 173a_1 of the second electrode layer 173a may have a cylindrical shape, e.g., may be conformal on an inner surface of the insertion layer 172a, and the second portion 173a_2 may cover upper ends of the first electrode layer 171a and the insertion layer 172a, e.g., the second portion 173a_2 may extend horizontally above uppermost surfaces of the first electrode layer 171a and the insertion layer 172a. In the present specification, the "first portion 173a_1" and the "second portion 173a_2" may be referred to as a cylindrical portion and an extending portion, respectively.

The dielectric layer 180a may cover the second electrode layer 173a, e.g., the dielectric layer 180a may continuously extend along an inner surface of the first portion 173a_1 of the second electrode layer 173a. The dielectric layer 180a may, e.g., directly, contact both the first portion 173a_1 and the second portion 173a_2 of the second electrode layer 173a. An upper electrode 190a may cover the dielectric layer 180a. The upper electrode 190a may include a portion filling an internal space defined by the first portion 173a_1 of the second electrode layer 173a.

Referring to FIG. 4B, at a level of line V-V of FIG. 4A, the data storage structure may include the upper electrode 190a, the dielectric layer 180a surrounding an external surface of the upper electrode 190a, the first portion 173a_1 of the second electrode layer 173a surrounding an external surface of the dielectric layer 180a, the insertion layer 172a surrounding an external surface of the first portion 173a_1 of the second electrode layer 173a, and the first electrode layer 171a surrounding an external surface of the insertion layer 172a. Referring to FIG. 4C, at a level of line VI-VI' of FIG. 4A, the data storage structure may include the upper electrode 190a, the dielectric layer 180a surrounding an external surface of the upper electrode 190a, and the second portion 173a_2 of the second electrode layer 173a surrounding an external surface of the dielectric layer 180a.

Figure 5A:
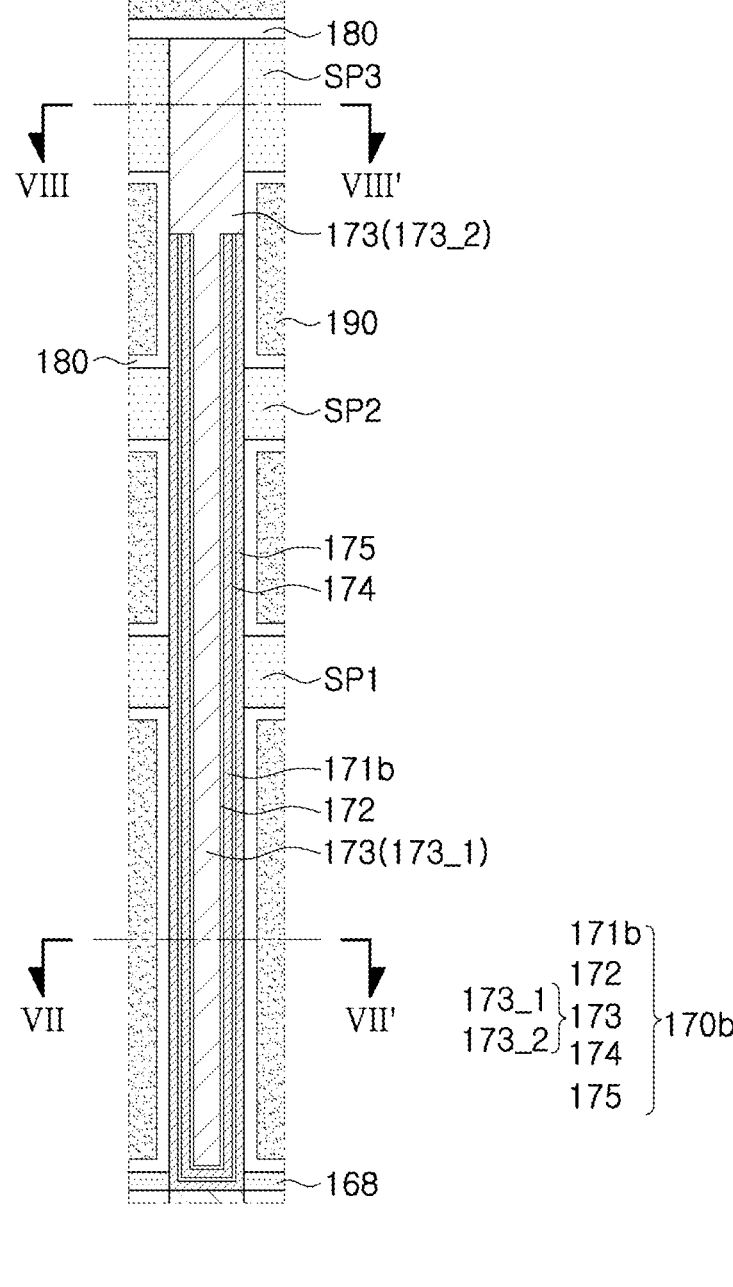
FIG. 5A is a schematic partially-enlarged view of a semiconductor device according to example embodiments.
Figure 5B:
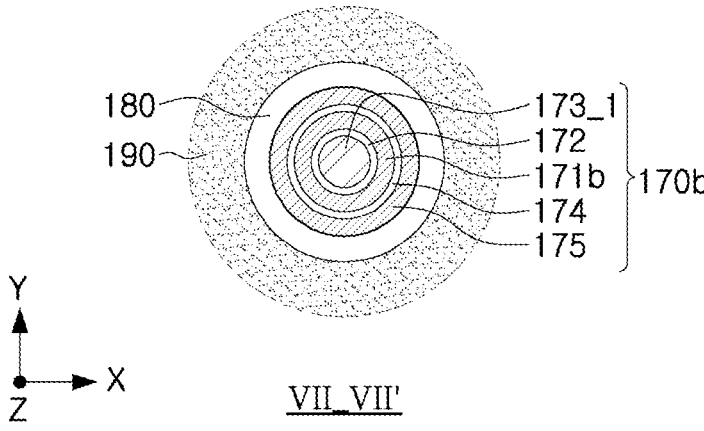
FIGS. 5B and 5C are schematic cross-sectional views of a semiconductor device according to example embodiments.
Figure 5C:
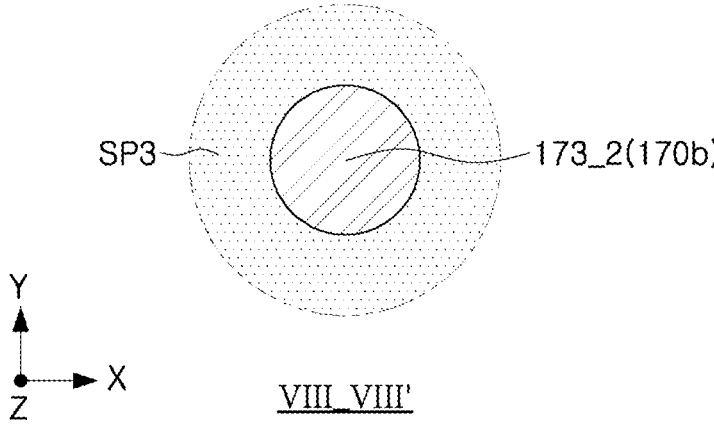

Referring to FIGS. 5A to 5C, the lower electrode 170b may further include a second insertion layer 174 and a third electrode layer 175. For example, the second insertion layer 174 and the third electrode layer 175 may be inserted between the dielectric layer 180 and the first electrode layer 171b.

In detail, the lower electrode 170b may include the third electrode layer 175 disposed on the upper conductive patterns (160 of FIG. 2), the second insertion layer 174 disposed on the third electrode layer 175, a first electrode layer 171b disposed on the second insertion layer 174, the first insertion layer 172 disposed on the first electrode layer 171b, and the second electrode layer 173 disposed on the first insertion layer 172. The first insertion layer 172 may be disposed between the first electrode layer 171b and the second electrode layer 173. The second insertion layer 174 may be disposed between the third electrode layer 175 and the first electrode layer 171b. The first insertion layer 172 and the second insertion layer 174 may be spaced apart from each other. An external side surface of the second portion 173_2 of the second electrode layer 173 may include a portion vertically aligned with an external side surface of the third electrode layer 175.

Each of the third electrode layer 175, the second insertion layer 174, the first electrode layer 171b, and the first insertion layer 172 may have a cylindrical shape. The second electrode layer 173 may include the first portion 173_1, filling an empty space defined by the first insertion layer 172, and the second portion 173_2 extending from the first portion 173_1. The second portion 173_2 may cover an upper end of the first insertion layer 172, an upper end of the first electrode layer 171b, an upper end of the second insertion layer 174, and an upper end of the third electrode layer 175. For example, as illustrated in FIG. 5A, each of the first portion 173_1 and the second portion 173_2 of the second electrode layer 173 may have a pillar shape. In another example, the first portion 173_1 of the second electrode layer 173 may have a cylindrical shape, and the second portion 173_2 of the second electrode layer 173 may have a shape extending from the first portion 173_1 to cover the upper ends of the first electrode layer 171b, the second insertion layer 174, and the third electrode layer 175.

The first electrode layer 171b, the second electrode layer 173, and the third electrode layer 175 may have stress in a direction different from a direction of stress of the first and second insertion layers 172 and 174. In example embodiments, the first electrode layer 171b, the second electrode layer 173, and the third electrode layer 175 may be formed of a conductive material having tensile stress, and the first insertion layer 172 and the second insertion layer 174 may be formed of a metal oxide having compressive stress. The first electrode layer 171b, the second electrode layer 173, and the third electrode layer 175 may include the same material or different materials. The first insertion layer 172 and the second insertion layer 174 may include the same material or different materials.

Referring to FIG. 5B, at a level of line VII-VII' of FIG. 5A, the lower electrode 170b may include the first portion 173_1 of the second electrode layer 173, the first insertion layer 172 surrounding an external surface of the first portion 173_1, the first electrode layer 171b surrounding an external surface of the first insertion layer 172, the second insertion layer 174 surrounding an external surface of the first electrode layer 171b, and the third electrode layer 175 surrounding an external surface of the second insertion layer 174. Referring to FIG. 5C, at a level of line VIII-VIII' of FIG. 5A, the lower electrode 170b may include the second portion 173_2.

Figure 6A:
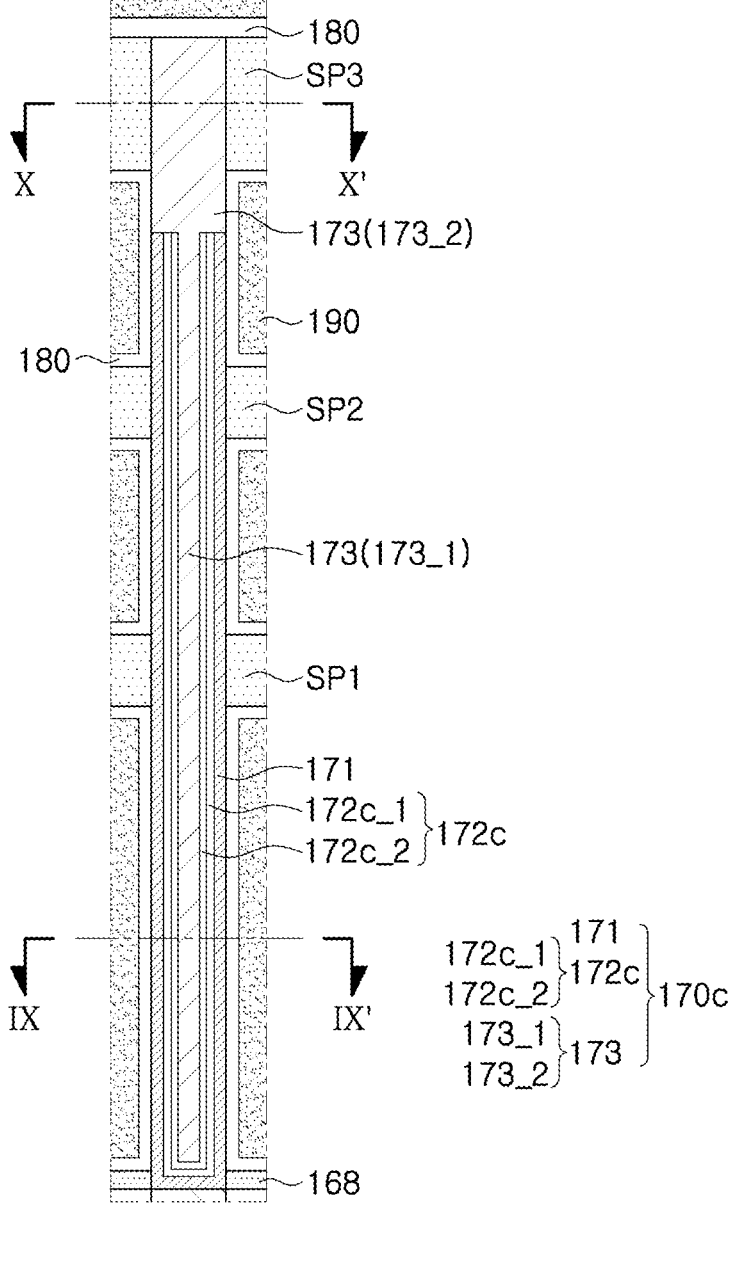
FIG. 6A is a schematic partially-enlarged view of a semiconductor device according to example embodiments.
Figure 6B:
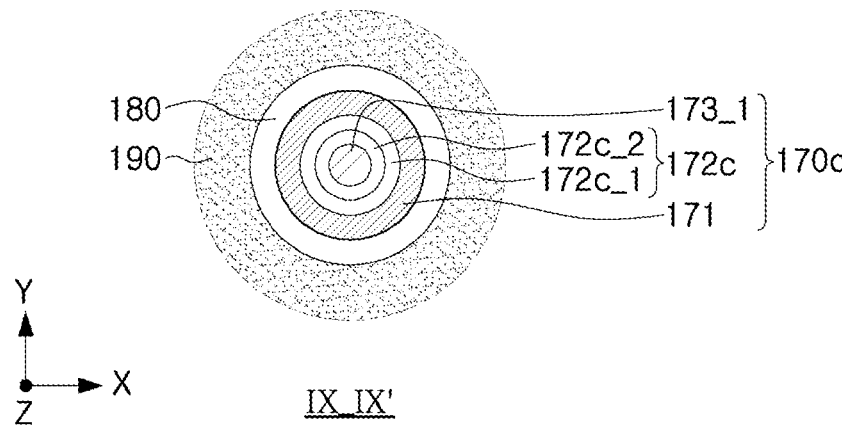
FIGS. 6B and 6C are schematic cross-sectional views of a semiconductor device according to example embodiments.
Figure 6C:
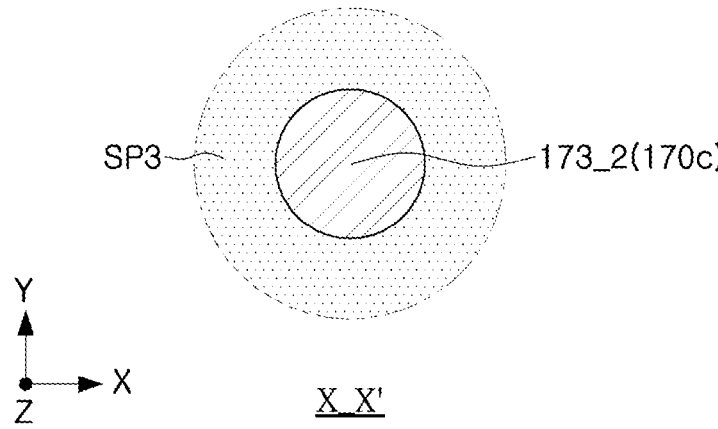

Referring to FIGS. 6A to 6C, the insertion layer 172c of the lower electrode 170c may include a plurality of material layers. For example, the insertion layer 172c may include a first material layer 172c_1 and a second material layer 172c_2.

An external surface of the first material layer 172c_1 may contact an internal surface of the first electrode layer 171, and an internal surface of the first material layer 172c_1 may contact an external surface of the second material layer 172c_2. An external surface of the second material layer 172c_2 may contact an internal surface of the first material layer 172c_1, and an internal surface of the second material layer 172c_2 may contact an external surface of the second electrode layer 173. The first material layer 172c_1 and the second material layer 172c_2 may have stress in a direction different from a direction of stress of the first electrode layer 171 and the second electrode layer 173. In example embodiments, when the first electrode layer 171 and the second electrode layer 173 have tensile stress, the first material layer 172c_1 and the second material layer 172c_2 may have compressive stress. The first material layer 172c_1 and the second material layer 172c_2 may include the same material or different materials.

Referring to FIG. 6B, at a level of line IX-IX' of FIG. 6A, the lower electrode 170c may include the first portion 173_1 of the second electrode layer 173, the second material layer 172c_2 surrounding an external surface of the first portion 173_1 of the second electrode layer 173, the first material layer 172c_1 surrounding an external surface of the second material layer 172c_2, and the first electrode layer 171 surrounding an external surface of the first material layer 172c_1. Referring to FIG. 6C, at a level of line X-X' of FIG. 6A, the lower electrode 170c may include the second portion 173_2.

FIGS. 7 to 12 are cross-sectional views illustrating stages in a method of fabricating a semiconductor device according to example embodiments. FIGS. 7 to 12 illustrate cross-sections corresponding to lines I-I' and of FIG. 2.

Figure 7:
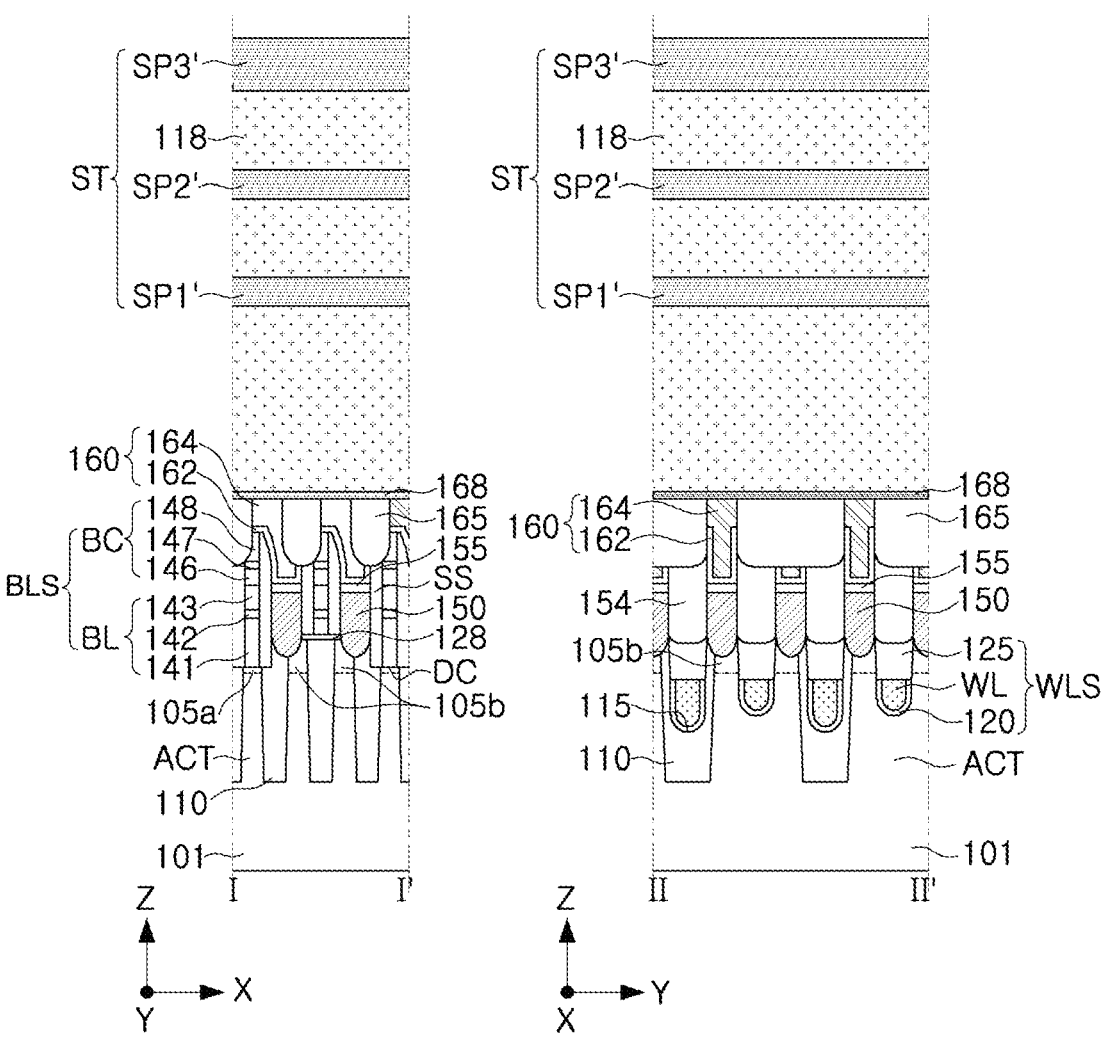
FIGS. 7 to 12 are schematic cross-sectional views illustrating stages in a method of fabricating a semiconductor device according to example embodiments.

Referring to FIG. 7, the isolation layer 110 may be formed in the substrate 101 to define the active region ACT. An isolation trench may be formed in the substrate 101, and the isolation layer 110 may fill the isolation trench. In a plan view, the active region ACT may have an elongated bar shape extending in a direction oblique to a direction in which the word line WL extends. An ion implantation process may be performed using the isolation layer 110 as an ion implantation mask to form impurity regions on the active region ACT. The active region ACT and the isolation layer 110 may be patterned to form the gate trench 115. A pair of gate trenches 115 may cross the active region ACT. The impurity regions may also be separated by the gate trench 115 to form the first impurity region 105a and the second impurity region 105b.

The gate dielectric layer 120 may be formed on an internal surface of the gate trench 115 to have a substantially conformal thickness. Then, the word line WL may be formed to fill at least a portion of the gate trench 115. An upper surface of the word line WL may be recessed to be lower than an upper surface of the active region ACT. An insulating layer may be stacked on the substrate 101 to fill the gate trench 115, and may then be etched to form the gate capping layer 125 on the word line WL.

An insulating layer and a conductive layer may be sequentially formed and patterned on an entire surface of the substrate 101 to form the buffer insulating layer 128 and the first conductive pattern 141 stacked sequentially. The buffer insulating layer 128 may be formed of at least one of a silicon oxide, a silicon nitride, and a silicon oxynitride. The buffer insulating layer 128 may include a plurality of buffer insulating layers 128 formed to be spaced apart from each other. The first conductive pattern 141 may have a shape corresponding to a planar shape of the buffer insulating layer 128. The buffer insulating layer 128 may be formed to simultaneously cover the end portions of two adjacent active regions ACT, e.g., adjacent second impurity regions 105b. Upper portions of the isolation layer 110, the substrate 101, and the gate capping layer 125 may be etched using the buffer insulating layer 128 and the first conductive pattern 141 as etching masks to form a bit line contact hole. The bit line contact hole may expose the first impurity region 105a.

The bit line contact pattern DC may be formed to fill the bit line contact hole. The formation of the bit line contact pattern DC may include forming a conductive layer to fill the bit line contact hole and performing a planarization process. For example, the bit line contact pattern DC may be formed of polysilicon. The second conductive pattern 142, the third conductive pattern 143, and the first to third capping patterns 146, 147, and 148 may be sequentially formed on the first conductive pattern 141, and the first to third conductive patterns 141, 142, and 143 may be sequentially etched using the three capping patterns 146, 147, and 148 as etch masks. As a result, the bit line structure BLS including the bit line BL including the first to third conductive patterns 141, 142, and 143 and the bit line capping pattern BC including the first to third capping patterns 146, 147, and 148 may be formed.

Spacer structures SS may be formed on side surfaces of the bit line structure BLS. The spacer structure SS may include a plurality of layers. Fence insulating patterns 154 may be formed between the spacer structures SS. The fence insulating patterns 154 may include a silicon nitride or a silicon oxynitride. An anisotropic etching process may be performed using the fence insulating patterns 154 and the third capping pattern 148 as etching masks to form opening exposing the second impurity region 105b.

The lower conductive pattern 150 may be formed below the opening. The lower conductive pattern 150 may be formed of a semiconductor material, e.g., polysilicon. For example, the lower conductive pattern 150 may be formed by forming a polysilicon layer to fill the opening and then performing an etch-back process.

The metal-semiconductor compound layer 155 may be formed on the lower conductive pattern 150. The formation of the metal-semiconductor compound layer 155 may include a metal layer deposition process and a heat treatment process.

The upper conductive pattern 160 may be formed on an upper portion of the opening. The formation of the upper conductive pattern 160 may include sequentially forming the barrier layer 162 and the conductive layer 164. Then, a patterning process may be performed on the barrier layer 162 and the conductive layer 164 to form the insulating patterns 165 penetrating therethrough. Accordingly, a lower structure including the substrate 101, the word line structure WLS, and the bit line structure BLS may be formed.

The etch-stop layer 168 may be conformally formed on a lower structure, and mold layers 118 and preliminary supporter layers SP1', SP2', and SP3' may be alternately stacked on the etch-stop layer 168. The mold layers 118 and the preliminary supporter layers SP1', SP2', and SP3' may constitute a stack structure ST. The etch-stop layer 168 may include an insulating material, having etch selectivity with respect to the mold layers 118 under specific etch conditions, e.g., at least one of a silicon oxide, a silicon nitride, a silicon carbide, a silicon oxycarbide, and a silicon carbonitride. The mold layers 118 may be formed of a silicon oxide, and the preliminary supporter layers SP1', SP2', and SP3' may be formed of a silicon nitride.

Figure 8:
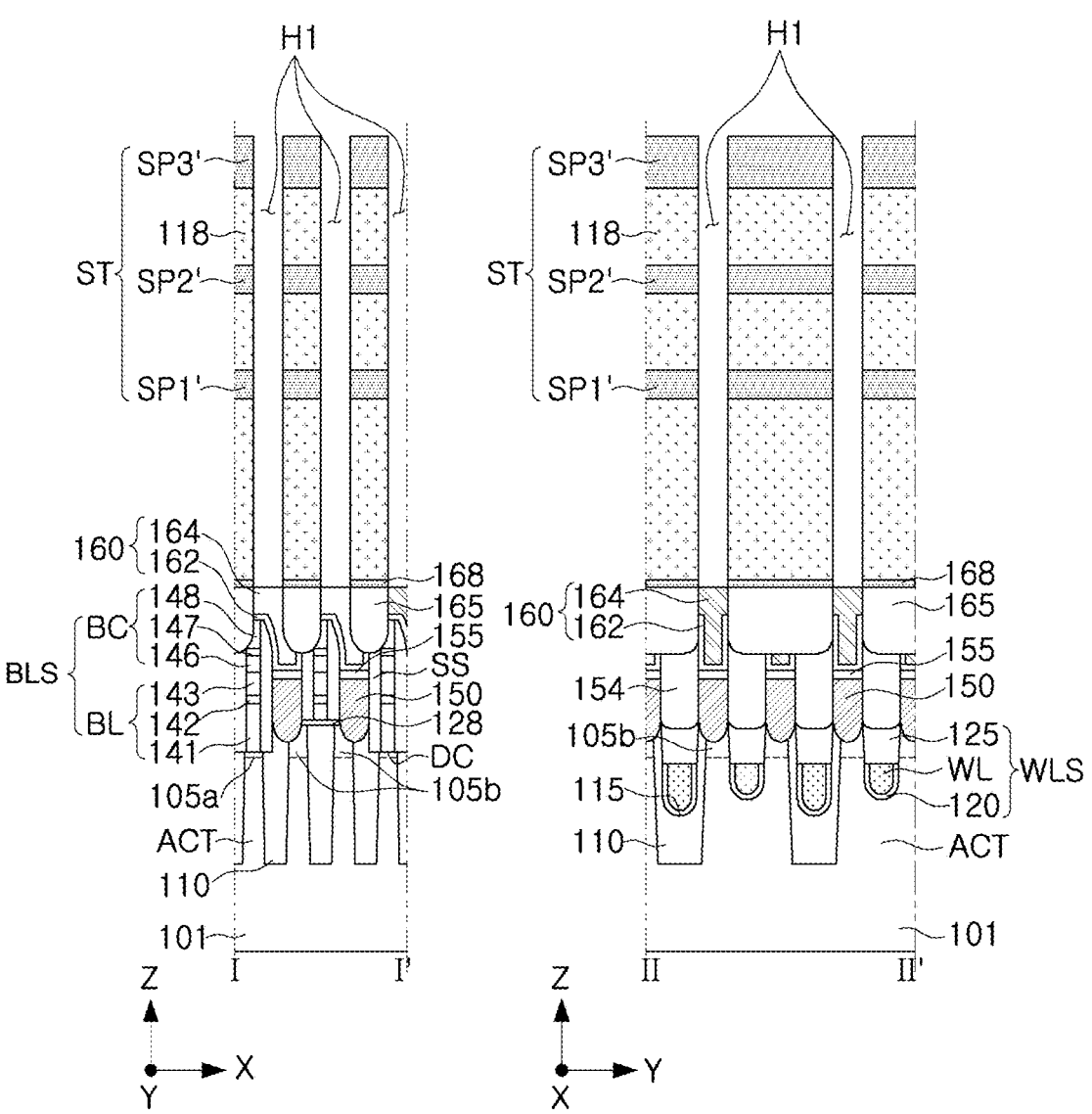

Referring to FIG. 8, a plurality of holes H1 may be formed to penetrate through the mold layers 118 and the preliminary supporter layers SP1', SP2', and SP3'. In the operation of forming the plurality of holes H1, the etch-stop layer 168 may serve as a stopper stopping the etching process. The plurality of holes H1 may penetrate through the etch-stop layer 168 to expose the upper conductive patterns 160. The plurality of holes H1 may be regions, in which the lower electrodes 170 are to be formed, and may be formed to be spaced apart from each other by a predetermined distance and to be arranged at regular intervals.

Figure 9:
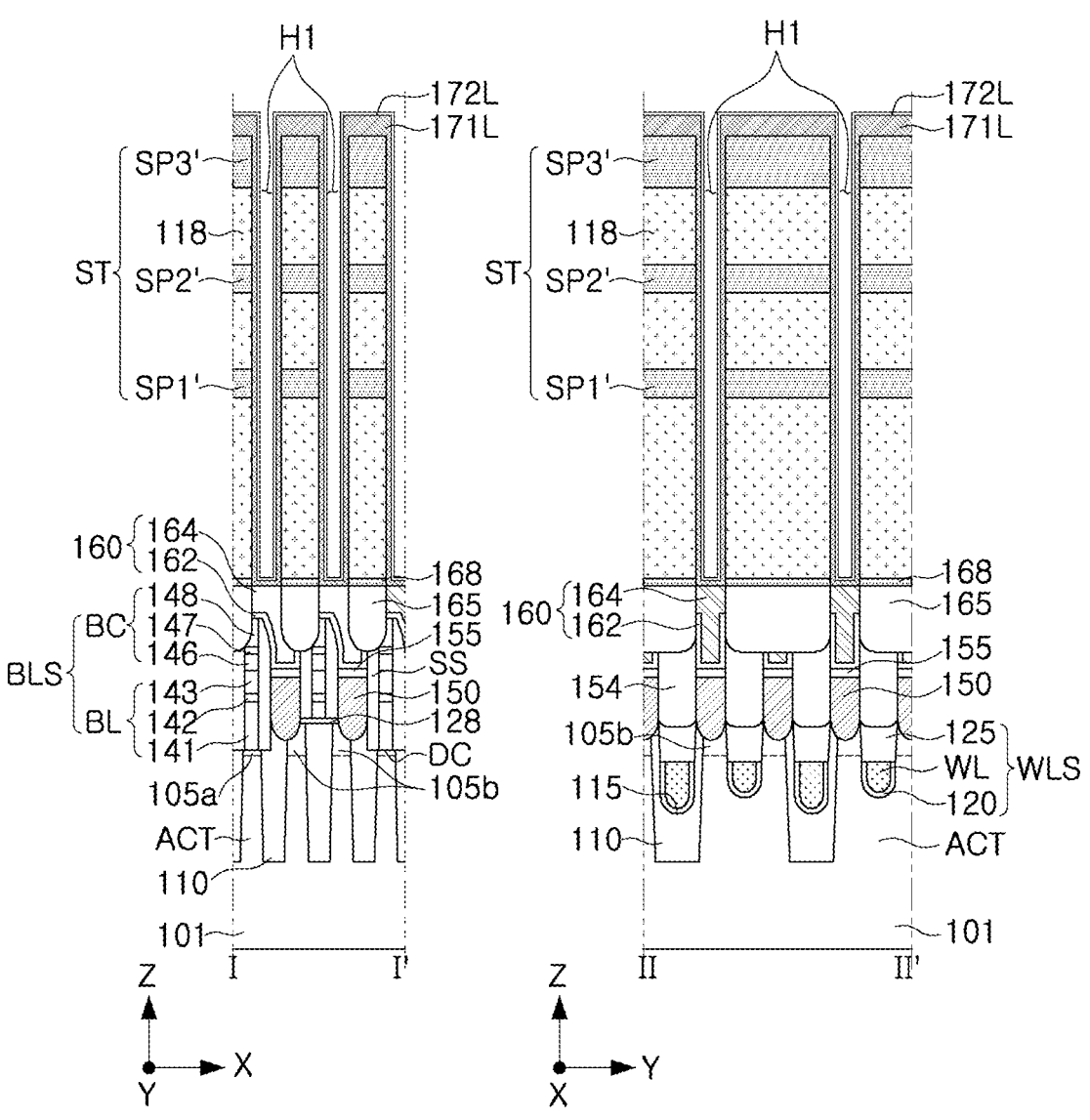

Referring to FIG. 9, a first preliminary electrode layer 171L and a preliminary insertion layer 172L may be formed in the plurality of holes H1.

The first preliminary electrode layer 171L may be formed, e.g., conformally, along a surface of the stack structure ST and upper surfaces of the upper conductive patterns 160 exposed by the plurality of holes H1. The first preliminary electrode layer 171L may be formed of a conductive material. The first preliminary electrode layer 171L may be formed of at least one of, e.g., polycrystalline silicon (Si), TiN, NbN, WN, VN, MoN, TaN, TiSiN, and TiCN. In example embodiments, the process of forming the first preliminary electrode layer 171L may be performed by atomic layer deposition (ALD), chemical vapor deposition (CVD), or physical vapor deposition (PVD).

The preliminary insertion layer 172L may be formed, e.g., conformally, on the first preliminary electrode layer 171L. The preliminary insertion layer 172L may be formed of a material having stress in a direction opposite to a direction of stress of the first preliminary electrode layer 171L. In example embodiments, when the first preliminary electrode layer 171L is formed of a material having tensile stress, the preliminary insertion layer 172L may be formed of a material having compressive stress. For example, the preliminary insertion layer 172L may be formed of a metal oxide, e.g., at least one of TiO, NbO, MoO, TaO, and TiON. In example embodiments, the process of forming the preliminary insertion layer 172L may be performed by atomic layer deposition (ALD), chemical vapor deposition (CVD), or physical vapor deposition (PVD). However, the process of forming the preliminary insertion layer 172L is not limited thereto, e.g., the preliminary insertion layer 172L may be formed by oxidizing the surface of the first preliminary electrode layer 171L. In this case, the preliminary insertion layer 172L may include a material forming the first preliminary electrode layer 171L.

Figure 10:
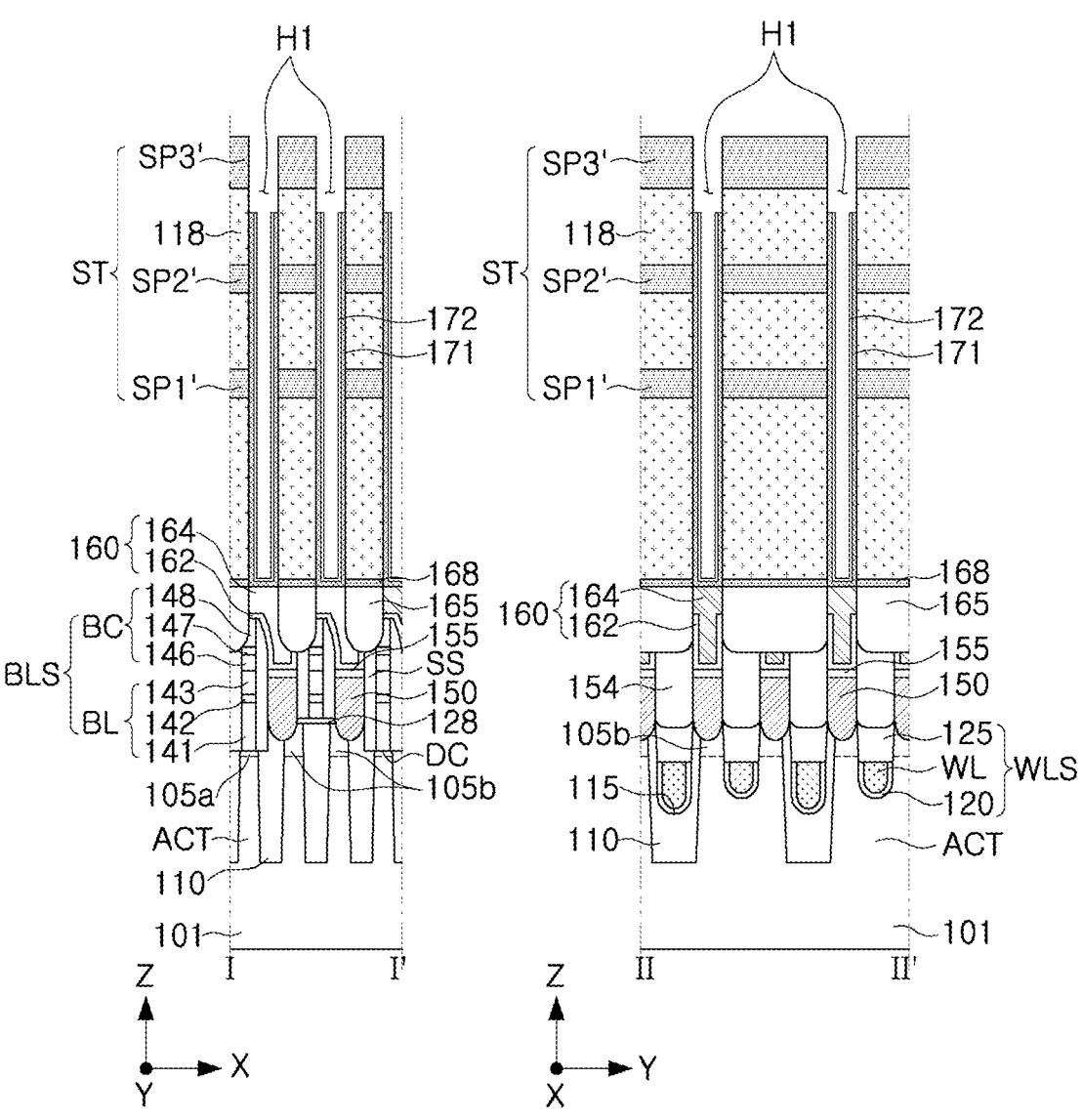

Referring to FIG. 10, the first electrode layer 171 and the insertion layer 172 may be formed in the plurality of holes H1. The first electrode layer 171 and the insertion layer 172 may be formed by etching a portion of the first preliminary electrode layer (171L of FIG. 9) and the preliminary insertion layer (172L of FIG. 9).

The first electrode layer 171 and the insertion layer 172 may be etched to have upper ends disposed at a level lower than a level of an upper surface of the stack structure ST. Each of the first electrode layer 171 and the insertion layer 172 may have a cylindrical shape. For example, the upper end of the first electrode layer 171 may be disposed at a substantially same level as the upper end of the insertion layer 172. In another example, the insertion layer 172 may be etched to have an upper end disposed at a level lower than a level of the upper end of the first electrode layer 171.

Figure 11:
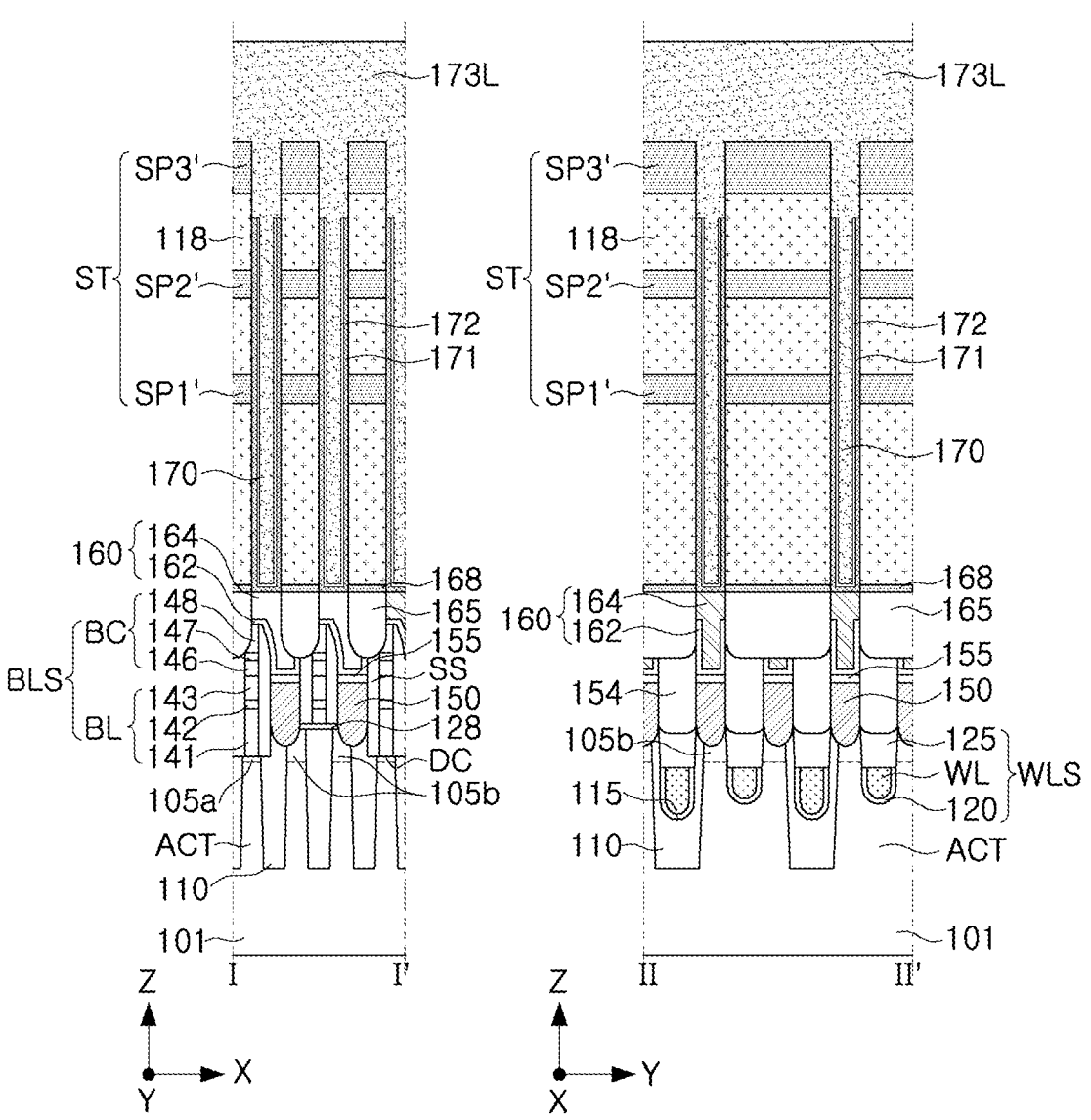

Referring to FIG. 11, a second preliminary electrode layer 173L may be formed to cover the first electrode layer 171, the insertion layer 172, and the stack structure ST. The second preliminary electrode layer 173L may be formed to, e.g., completely, fill the plurality of holes H1 including an empty space defined by the cylindrical shape of the insertion layer 172 and to cover the upper surface of the stack structure ST.

The second preliminary electrode layer 173L may cover upper ends of the first electrode layer 171 and the insertion layer 172. The second preliminary electrode layer 173L may be formed of a conductive material. The second preliminary electrode layer 173L may be formed of at least one of, e.g., polycrystalline silicon (Si), TiN, NbN, WN, VN, MoN, TaN, TiSiN, and TiCN. In example embodiments, the process of forming the second preliminary electrode layer 173L may be performed by atomic layer deposition (ALD), chemical vapor deposition (CVD), or physical vapor deposition (PVD). The second preliminary electrode layer 173L may include the same material as the first electrode layer 171 or a material different from a material of the first electrode layer 171.

Figure 12:
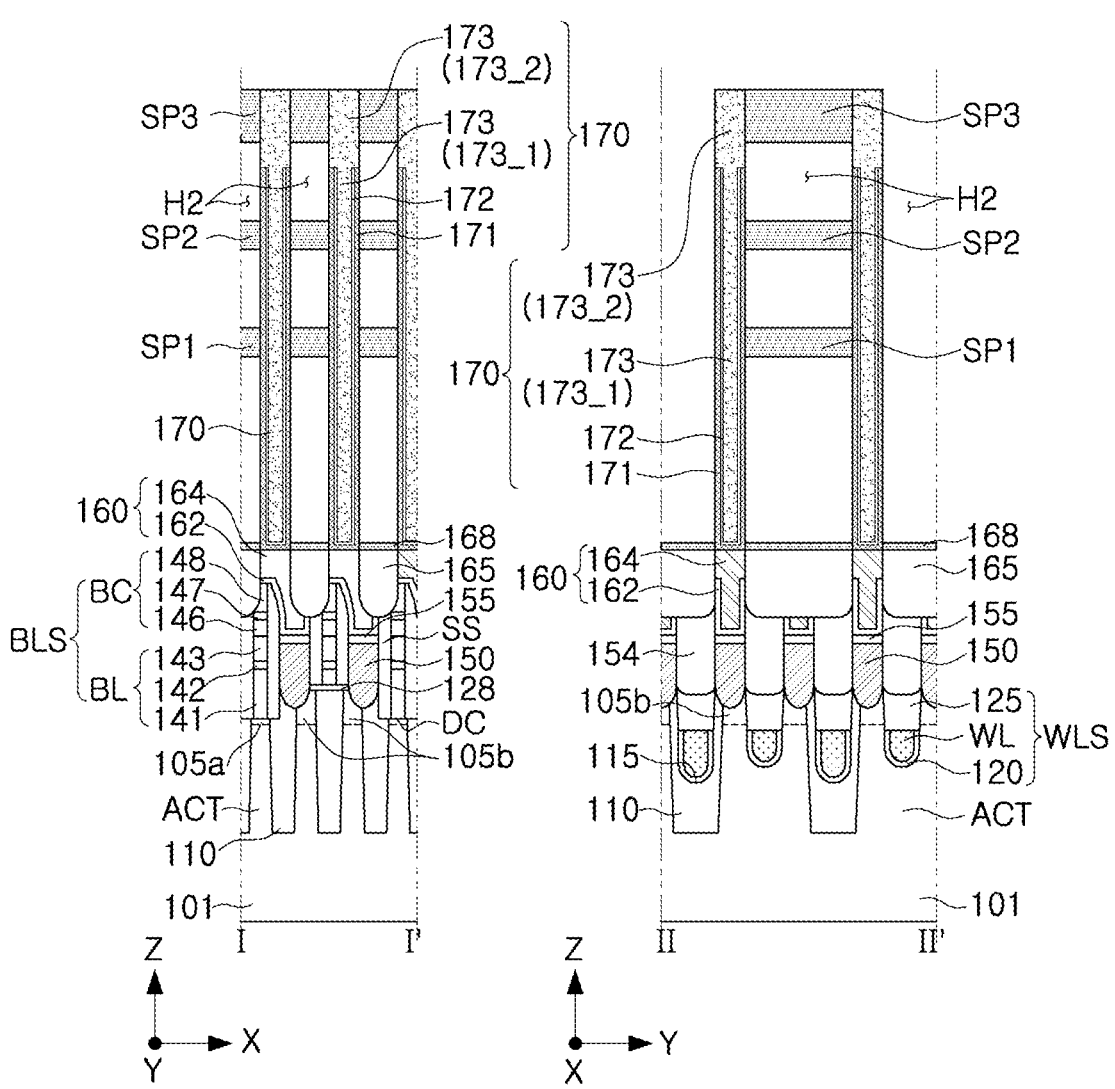

Referring to FIG. 12, the second electrode layer 173 may be formed, and the mold layers 118 may be removed. A portion of the second preliminary electrode layer (173L of FIG. 11) may be etched to form the second electrode layer 173 including the first portion 173_1 and the second portion 173_2.

Accordingly, lower electrodes 170 including the first electrode layer 171, the insertion layer 172, and the second electrode layer 173 may be formed. In example embodiments, the second electrode layer 173 may be etched to have an upper surface disposed at a same level as an upper surface of the third supporter layer SP3, an uppermost supporter layer. However, the shape of the second electrode layer 173 is not limited thereto, e.g., the upper surface of the second electrode layer 173 may be disposed at a level lower than a level of the upper surface of the third supporter layer SP3.

Then, an additional mask may be formed on the second preliminary electrode layer (173L of FIG. 11), and at least a portion of the mold layers (118 of FIG. 11) and the preliminary supporter layers (SP1', SP2', SP3' of FIG. 11) may be removed using the mask. Accordingly, the preliminary supporter layers SP1', SP2', and SP3' of FIG. 11 may form the first to third supporter layers SP1, SP2, and SP3. The first to third supporter layers SP1, SP2, and SP3 may be patterned according to a structure of the mask to have a shape including a plurality of openings. The plurality of openings may be disposed between four adjacent lower electrodes 170, as illustrated in FIG. 1A, or may be disposed between three adjacent lower electrodes 170, as illustrated in FIGS. 1B and 1C. The first to third supporter layers SP1, SP2, and SP3 may connect the adjacent lower electrodes 170 to each other. The mold layers 118 may be selectively removed with respect to the supporter layers SP1, SP2, and SP3. In example embodiments, the process of removing the mold layers 118 may be performed by a wet etching process using an etchant (e.g., a hydrogen fluoride (HF) solution). The mask may be removed after etching the mold layers 118 or while etching the mold layers 118. An empty space H2 may be formed in a region in which the mold layers 118 are removed.

Returning to FIGS. 1A, 2 and 3A to 3C, the dielectric layer 180 may be formed to cover the lower electrodes 170, and the upper electrode 190 may be formed to cover the dielectric layer 180. Each of the process of forming the dielectric layer 180 and the upper electrode 190 may be performed by atomic layer deposition (ALD), chemical vapor deposition (CVD), or physical vapor deposition (PVD). Accordingly, the data storage structure CAP including the lower electrodes 170, the dielectric layer 180, and the upper electrode 190 may be formed, and thus the semiconductor device 100 including the data storage structure CAP may be fabricated.

By way of summation and review, example embodiments provide a semiconductor device having improved electrical characteristics and reliability. That is, as described above, a semiconductor device according to example embodiments may include a data storage structure including a lower electrode in which an insertion layer is interposed between electrode layers. Accordingly, physical deformation of the lower electrode may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a substrate;
a plurality of lower electrodes on the substrate;
a dielectric layer covering the plurality of lower electrodes; and
an upper electrode covering the dielectric layer,
wherein each of the plurality of lower electrodes includes:
  a first electrode layer having a cylindrical shape,
  a first insertion layer on the first electrode layer and having a cylindrical shape, and a second electrode layer on the first insertion layer and extending to cover an upper end of the first electrode layer and an upper end of the first insertion layer, wherein at least one of the first electrode layer and the second electrode layer has a first stress, wherein the first insertion layer has a second stress different from the first stress, wherein the first stress is one of a tensile stress and a compressive stress, and wherein the second stress is the other of the tensile stress and the compressive stress.

2. The semiconductor device as claimed in claim 1, wherein the first insertion layer is surrounded by the first electrode layer and the second electrode layer.

3. The semiconductor device as claimed in claim 1, wherein the first stress is the tensile stress, and the second stress is the compressive stress.

4. The semiconductor device as claimed in claim 1, wherein:

each of the first electrode layer and the second electrode layer includes at least one of polycrystalline silicon (Si), TiN, NbN, WN, VN, MoN, TaN, TiSiN, and TiCN, and the first insertion layer includes at least one of TiO, NbO, MoO, TaO, and TiON.

5. The semiconductor device as claimed in claim 1, wherein the first insertion layer has a thickness greater than 0 angstroms and less than about 10 angstroms.

6. The semiconductor device as claimed in claim 1, wherein the upper end of the first electrode layer and the upper end of the first insertion layer are at a substantially same level.

7. The semiconductor device as claimed in claim 1, wherein an external side surface of the second electrode layer includes a portion vertically aligned with an external side surface of the first electrode layer.

8. The semiconductor device as claimed in claim 1, wherein the second electrode layer includes:

a first pillar portion filling an internal space defined by the first insertion layer; and a second pillar portion on the first pillar portion and covering the upper end of the first electrode layer and the upper end of the first insertion layer.

9. The semiconductor device as claimed in claim 8, wherein:

the first pillar portion has a first width, and the second pillar portion has a second width greater than the first width.

10. The semiconductor device as claimed in claim 1, wherein the second electrode layer includes:

a cylindrical portion on an internal surface of the first insertion layer; and an extension portion extending from the cylindrical portion to cover the upper end of the first electrode layer and the upper end of the first insertion layer.

11. The semiconductor device as claimed in claim 10, wherein the upper electrode includes a portion filling an internal space defined by the cylindrical portion of the second electrode layer.

12. The semiconductor device as claimed in claim 1, wherein the first insertion layer includes a plurality of stacked material layers.

13. The semiconductor device as claimed in claim 1, further comprising:

a second insertion layer having a cylindrical shape and surrounding an external surface of the first electrode layer; and a third electrode layer having a cylindrical shape and surrounding an external surface of the second insertion layer.

14. The semiconductor device as claimed in claim 13, wherein the second insertion layer is spaced apart from the first insertion layer.

15. The semiconductor device as claimed in claim 13, wherein an external side surface of the second electrode layer includes a portion vertically aligned with an external side surface of the third electrode layer.

16. A semiconductor device, comprising:

a substrate;

a plurality of lower electrodes on the substrate;

a dielectric layer covering the plurality of lower electrodes; and an upper electrode covering the dielectric layer, wherein each of the plurality of lower electrodes includes:

a first electrode layer, a second electrode layer on the first electrode layer, and an insertion layer between the first electrode layer and the second electrode layer, the insertion layer being surrounded by the first electrode layer and the second electrode layer, and the insertion layer having a cylindrical shape and including a metal oxide, wherein the insertion layer is spaced apart from the dielectric layer, and wherein an upper end of the insertion layer and an upper end of the first electrode layer are in contact with the second electrode layer.

17. The semiconductor device as claimed in claim 16, wherein:

the first electrode layer is in contact with an external surface of the insertion layer, and the second electrode layer is in contact with an internal surface of the insertion layer and extends to cover an upper end of the insertion layer.

18. The semiconductor device as claimed in claim 16, wherein:

the first electrode layer and the second electrode layer have tensile stress, and the insertion layer has compressive stress.

19. A semiconductor device, comprising:

an isolation layer on a substrate, the isolation layer defining active regions;

gate electrodes crossing the active regions and extending into the isolation layer;

first impurity regions and second impurity regions in the active regions on opposite sides adjacent to the gate electrodes;

bit lines on the gate electrodes and the active regions, the bit lines being electrically connected to the first impurity regions;

conductive patterns on side surfaces of the bit lines and electrically connected to the second impurity regions;

a plurality of lower electrodes extending vertically on the conductive patterns and electrically connected to each of the conductive patterns;

at least one supporter layer contacting a side surface of each of the plurality of lower electrodes;

a dielectric layer covering the plurality of lower electrodes and the at least one supporter layer; and an upper electrode covering the dielectric layer, wherein each of the plurality of lower electrodes includes:

a first electrode layer having a cylindrical shape, an insertion layer on an internal surface of the first electrode layer, having a cylindrical shape, and including a metal oxide, and a second electrode layer on an internal surface of the insertion layer and extending to cover an upper end of the first electrode layer and an upper end of the insertion layer, wherein the insertion layer is spaced apart from the dielectric layer, and wherein an upper end of the insertion layer and an upper end of the first electrode layer are in contact with the second electrode layer.

20. The semiconductor device as claimed in claim 19, wherein:

the at least one supporter layer includes a lower supporter layer and an upper supporter layer, the upper supporter layer being at a level higher than a level of the lower supporter layer, the lower supporter layer is in contact with the first electrode layer and is spaced apart from the second electrode layer, and the upper supporter layer is in contact with the second electrode layer.

* * * * *